(12) United States Patent
Lesher

(10) Patent No.: US 8,069,491 B2
(45) Date of Patent: *Nov. 29, 2011

(54) PROBE TESTING STRUCTURE

(75) Inventor: Timothy E. Lesher, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 1061 days.

This patent is subject to a terminal disclaimer.

(21) Appl. No.: 11/820,877

(22) Filed: Jun. 20, 2007

(65) Prior Publication Data

US 2008/0218187 A1    Sep. 11, 2008

Related U.S. Application Data

(63) Continuation of application No. 10/794,246, filed on Mar. 5, 2004, now Pat. No. 7,250,626.

(60) Provisional application No. 60/513,663, filed on Oct. 22, 2003.

(51) Int. Cl.
*G01Q 40/00* (2010.01)

(52) U.S. Cl. ............................................ 850/19; 850/20

(58) Field of Classification Search ........................ None
See application file for complete search history.

(56) References Cited

U.S. PATENT DOCUMENTS

| | | |
|---|---|---|
| 1,191,486 A | 7/1916 | Tyler |
| 1,337,866 A | 4/1920 | Whitacker |
| 2,106,003 A | 1/1938 | Hewitt |
| 2,142,625 A | 1/1939 | Zoethout |
| 2,197,081 A | 4/1940 | Piron |
| 2,264,685 A | 12/1941 | Wells |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |

(Continued)

FOREIGN PATENT DOCUMENTS

CN    1083975    3/1994

(Continued)

OTHER PUBLICATIONS

Mark S. Boguski and Martin W. McIntosh, "Biomedical informatics for proteomics," insight: review article, Nature 422, 233-237 (2003); doi:10.1038/nature01515.

(Continued)

*Primary Examiner* — Robert Kim
*Assistant Examiner* — Andrew Smyth
(74) *Attorney, Agent, or Firm* — DASCENZO Intellectual Property Law, P.C.

(57) ABSTRACT

A calibration structure for probing devices.

53 Claims, 11 Drawing Sheets

U.S. PATENT DOCUMENTS

| | | |
|---|---|---|
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A * | 9/1987 | Lockwood et al. ...... 324/750.27 |
| 4,703,433 A | 10/1987 | Sharrit |
| 4,705,447 A | 11/1987 | Smith |
| 4,709,141 A | 11/1987 | Olsen et al. |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,831,494 A | 5/1989 | Arnold et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason et al. |

| Patent | Date | Inventor(s) |
|---|---|---|
| 4,853,613 A | 8/1989 | Sequeira et al. |
| 4,853,624 A | 8/1989 | Rabjohn |
| 4,853,627 A | 8/1989 | Gleason et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,864,227 A | 9/1989 | Sato |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,891,584 A | 1/1990 | Kamieniecki et al. |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,918,383 A | 4/1990 | Huff et al. |
| 4,922,128 A | 5/1990 | Dhong et al. |
| 4,922,186 A | 5/1990 | Tsuchiya et al. |
| 4,923,407 A | 5/1990 | Rice et al. |
| 4,926,118 A | 5/1990 | O'Connor et al. |
| 4,929,893 A | 5/1990 | Sato et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A * | 2/1991 | Carlton et al. ........... 324/750.02 |
| 5,001,423 A | 3/1991 | Abrami et al. |
| 5,006,796 A | 4/1991 | Burton et al. |
| 5,010,296 A | 4/1991 | Okada et al. |
| 5,019,692 A | 5/1991 | Nbedi et al. |
| 5,030,907 A | 7/1991 | Yih et al. |
| 5,034,688 A | 7/1991 | Moulene et al. |
| 5,041,782 A | 8/1991 | Marzan |
| 5,045,781 A | 9/1991 | Gleason et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,070,297 A | 12/1991 | Kwon et al. |
| 5,077,523 A | 12/1991 | Blanz |
| 5,082,627 A | 1/1992 | Stanbro |
| 5,084,671 A | 1/1992 | Miyata et al. |
| 5,089,774 A | 2/1992 | Nakano |
| 5,091,691 A | 2/1992 | Kamieniecki et al. |
| 5,091,692 A | 2/1992 | Ohno et al. |
| 5,091,732 A | 2/1992 | Mileski et al. |
| 5,094,536 A | 3/1992 | MacDonald et al. |
| 5,095,891 A | 3/1992 | Reitter |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,136,237 A | 8/1992 | Smith et al. |
| 5,142,224 A | 8/1992 | Smith et al. |
| 5,144,228 A | 9/1992 | Sorna et al. |
| 5,159,262 A * | 10/1992 | Rumbaugh et al. ...... 324/754.03 |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,164,661 A | 11/1992 | Jones |
| 5,166,606 A | 11/1992 | Blanz |
| 5,172,049 A | 12/1992 | Kiyokawa et al. |
| 5,172,051 A | 12/1992 | Zamborelli |
| 5,187,443 A | 2/1993 | Bereskin |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,210,377 A | 5/1993 | Kennedy et al. |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A * | 7/1993 | Williams et al. ................ 333/12 |
| 5,227,730 A | 7/1993 | King et al. |
| 5,232,789 A | 8/1993 | Platz et al. |
| 5,233,197 A | 8/1993 | Bowman et al. |
| 5,233,291 A | 8/1993 | Kouno et al. |
| 5,233,306 A | 8/1993 | Misra |
| 5,237,267 A | 8/1993 | Harwood et al. |
| 5,245,292 A | 9/1993 | Milesky et al. |
| 5,266,889 A | 11/1993 | Harwood et al. |
| 5,267,088 A | 11/1993 | Nomura |
| 5,268,636 A * | 12/1993 | Phillips et al. ........... 324/762.02 |
| 5,270,664 A | 12/1993 | McMurtry et al. |
| 5,274,336 A | 12/1993 | Crook et al. |
| 5,278,494 A | 1/1994 | Obigane |
| 5,280,156 A | 1/1994 | Niori et al. |
| 5,298,972 A | 3/1994 | Heffner |
| 5,303,938 A | 4/1994 | Miller et al. |
| 5,304,924 A | 4/1994 | Yamano et al. |
| 5,309,088 A | 5/1994 | Chen |
| 5,315,237 A | 5/1994 | Iwakura et al. |
| 5,321,352 A | 6/1994 | Takebuchi |
| 5,321,453 A | 6/1994 | Mori et al. |
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,357,211 A | 10/1994 | Bryson et al. |
| 5,363,050 A | 11/1994 | Guo et al. |
| 5,369,368 A | 11/1994 | Kassen et al. |
| 5,369,370 A | 11/1994 | Stratmann et al. |
| 5,371,457 A | 12/1994 | Lipp |
| 5,373,231 A | 12/1994 | Boll et al. |
| 5,374,938 A | 12/1994 | Hatazawa et al. |
| 5,376,790 A | 12/1994 | Linker et al. |
| 5,382,898 A | 1/1995 | Subramanian |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,502 A * | 7/1995 | Walters et al. ........... 324/750.02 |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,477,137 A * | 12/1995 | Staudinger et al. ...... 324/754.03 |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,485,029 A * | 1/1996 | Crabbe et al. ................ 257/501 |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |

| | | | | | | |
|---|---|---|---|---|---|---|
| 5,500,606 A | 3/1996 | Holmes | | 5,793,213 A | 8/1998 | Bockelman et al. |
| 5,505,150 A | 4/1996 | James et al. | | 5,794,133 A | 8/1998 | Kashima |
| 5,506,498 A | 4/1996 | Anderson et al. | | 5,798,652 A | 8/1998 | Taraci |
| 5,506,515 A | 4/1996 | Godshalk et al. | | 5,802,856 A | 9/1998 | Schaper et al. |
| 5,508,631 A | 4/1996 | Manku et al. | | 5,804,982 A | 9/1998 | Lo et al. |
| 5,510,792 A | 4/1996 | Ono et al. | | 5,804,983 A | 9/1998 | Nakajima et al. |
| 5,511,010 A | 4/1996 | Burns | | 5,807,107 A | 9/1998 | Bright et al. |
| 5,512,835 A | 4/1996 | Rivera et al. | | 5,811,751 A | 9/1998 | Leong et al. |
| 5,515,167 A | 5/1996 | Ledger et al. | | 5,824,494 A | 10/1998 | Feldberg |
| 5,517,111 A | 5/1996 | Shelor | | 5,828,225 A | 10/1998 | Obikane et al. |
| 5,521,522 A | 5/1996 | Abe et al. | | 5,829,437 A | 11/1998 | Bridges |
| 5,523,694 A | 6/1996 | Cole, Jr. | | 5,831,442 A | 11/1998 | Heigl |
| 5,528,158 A | 6/1996 | Sinsheimer et al. | | 5,833,601 A | 11/1998 | Swartz et al. |
| 5,530,371 A | 6/1996 | Perry et al. | | 5,835,997 A | 11/1998 | Yassine et al. |
| 5,530,372 A | 6/1996 | Lee et al. | | 5,838,161 A | 11/1998 | Akram et al. |
| 5,532,609 A | 7/1996 | Harwood et al. | | 5,841,288 A | 11/1998 | Meaney et al. |
| 5,539,323 A | 7/1996 | Davis, Jr. | | 5,846,708 A | 12/1998 | Hollis et al. |
| 5,539,676 A | 7/1996 | Yamaguchi | | 5,847,569 A | 12/1998 | Ho et al. |
| 5,546,012 A | 8/1996 | Perry et al. | | 5,848,500 A | 12/1998 | Kirk |
| 5,550,480 A | 8/1996 | Nelson et al. | | 5,849,355 A * | 12/1998 | McHenry ................ 427/79 |
| 5,550,482 A | 8/1996 | Sano | | 5,852,232 A | 12/1998 | Samsavar et al. |
| 5,552,716 A | 9/1996 | Takahashi et al. | | 5,854,608 A | 12/1998 | Leisten |
| 5,554,236 A | 9/1996 | Singles et al. | | 5,857,667 A | 1/1999 | Lee |
| 5,561,377 A | 10/1996 | Strid et al. | | 5,861,743 A | 1/1999 | Pye et al. |
| 5,561,585 A | 10/1996 | Barnes et al. | | 5,867,073 A | 2/1999 | Weinreb et al. |
| 5,565,788 A | 10/1996 | Burr et al. | | 5,869,326 A | 2/1999 | Hofmann |
| 5,565,881 A | 10/1996 | Phillips et al. | | 5,869,975 A | 2/1999 | Strid et al. |
| 5,569,591 A | 10/1996 | Kell et al. | | 5,874,361 A | 2/1999 | Collins et al. |
| 5,571,324 A | 11/1996 | Sago et al. | | 5,879,289 A | 3/1999 | Yarush et al. |
| 5,572,398 A | 11/1996 | Federlin et al. | | 5,883,522 A | 3/1999 | O'Boyle |
| 5,578,932 A | 11/1996 | Adamian | | 5,883,523 A | 3/1999 | Ferland et al. |
| 5,583,445 A | 12/1996 | Mullen | | 5,888,075 A | 3/1999 | Hasegawa et al. |
| 5,584,608 A | 12/1996 | Gillespie | | 5,892,539 A | 4/1999 | Colvin |
| 5,594,358 A | 1/1997 | Ishikawa et al. | | 5,900,737 A | 5/1999 | Graham et al. |
| 5,600,256 A | 2/1997 | Woith et al. | | 5,903,143 A | 5/1999 | Mochizuki et al. |
| 5,604,444 A | 2/1997 | Harwood et al. | | 5,905,421 A | 5/1999 | Oldfield |
| 5,610,529 A | 3/1997 | Schwindt | | 5,910,727 A | 6/1999 | Fujihara et al. |
| 5,611,946 A | 3/1997 | Leong et al. | | 5,911,833 A * | 6/1999 | Denison et al. ............. 134/1.1 |
| 5,617,035 A | 4/1997 | Swapp | | 5,914,611 A * | 6/1999 | Cheng .................... 324/719 |
| 5,628,057 A | 5/1997 | Phillips et al. | | 5,916,689 A | 6/1999 | Collins et al. |
| 5,629,631 A | 5/1997 | Perry et al. | | 5,923,177 A | 7/1999 | Wardwell |
| 5,631,571 A | 5/1997 | Spaziani et al. | | 5,926,028 A | 7/1999 | Mochizuki |
| 5,633,780 A | 5/1997 | Cronin | | 5,926,029 A * | 7/1999 | Ference et al. ............. 324/750.2 |
| 5,640,101 A | 6/1997 | Kuji et al. | | 5,942,907 A | 8/1999 | Chiang |
| 5,642,298 A | 6/1997 | Mallory et al. | | 5,944,093 A | 8/1999 | Viswanath |
| 5,644,248 A | 7/1997 | Fujimoto | | 5,945,836 A | 8/1999 | Sayre et al. |
| 5,646,538 A | 7/1997 | Lide et al. | | 5,949,383 A | 9/1999 | Hayes et al. |
| 5,653,939 A | 8/1997 | Hollis et al. | | 5,949,579 A | 9/1999 | Baker |
| 5,656,942 A | 8/1997 | Watts et al. | | 5,952,842 A | 9/1999 | Fujimoto |
| 5,657,394 A | 8/1997 | Schwartz et al. | | 5,959,461 A | 9/1999 | Brown et al. |
| 5,659,255 A | 8/1997 | Strid et al. | | 5,960,411 A | 9/1999 | Hartman et al. |
| 5,659,421 A | 8/1997 | Rahmel et al. | | 5,963,027 A | 10/1999 | Peters |
| 5,663,653 A | 9/1997 | Schwindt et al. | | 5,963,364 A | 10/1999 | Leong et al. |
| 5,666,063 A | 9/1997 | Abercrombie et al. | | 5,970,429 A | 10/1999 | Martin |
| 5,668,470 A | 9/1997 | Shelor | | 5,973,505 A | 10/1999 | Strid et al. |
| 5,669,316 A | 9/1997 | Faz et al. | | 5,974,662 A | 11/1999 | Eldridge et al. |
| 5,670,322 A | 9/1997 | Eggers et al. | | 5,981,268 A | 11/1999 | Kovacs et al. |
| 5,670,888 A | 9/1997 | Cheng | | 5,982,166 A | 11/1999 | Mautz |
| 5,672,816 A | 9/1997 | Park et al. | | 5,993,611 A | 11/1999 | Moroney, III et al. |
| 5,675,499 A | 10/1997 | Lee et al. | | 5,995,914 A | 11/1999 | Cabot |
| 5,675,932 A | 10/1997 | Mauney | | 5,996,102 A | 11/1999 | Haulin |
| 5,676,360 A | 10/1997 | Boucher et al. | | 5,998,768 A | 12/1999 | Hunter et al. |
| 5,680,039 A | 10/1997 | Mochizuki et al. | | 5,999,268 A | 12/1999 | Yonezawa et al. |
| 5,682,337 A | 10/1997 | El-Fishawy et al. | | 6,001,760 A | 12/1999 | Katsuda et al. |
| 5,685,232 A | 11/1997 | Inoue | | 6,002,236 A | 12/1999 | Trant et al. |
| 5,691,648 A * | 11/1997 | Cheng ..................... 324/716 | | 6,002,263 A | 12/1999 | Peters et al. |
| 5,704,355 A | 1/1998 | Bridges | | 6,002,426 A | 12/1999 | Back et al. |
| 5,712,571 A | 1/1998 | O'Donoghue | | 6,004,029 A * | 12/1999 | Moslehi et al. ............... 374/1 |
| 5,715,819 A | 2/1998 | Svenson et al. | | 6,013,586 A | 1/2000 | McGhee et al. |
| 5,729,150 A | 3/1998 | Schwindt | | 6,019,612 A | 2/2000 | Hasegawa et al. |
| 5,731,708 A | 3/1998 | Sobhami | | 6,023,209 A | 2/2000 | Faulkner et al. |
| 5,731,920 A | 3/1998 | Katsuragawa | | 6,023,408 A * | 2/2000 | Schaper ................... 361/306.2 |
| 5,744,971 A | 4/1998 | Chan et al. | | 6,028,435 A | 2/2000 | Nikawa |
| 5,748,506 A | 5/1998 | Bockelman | | 6,029,141 A | 2/2000 | Bezos et al. |
| 5,751,252 A | 5/1998 | Phillips | | 6,031,383 A | 2/2000 | Streib et al. |
| 5,767,690 A | 6/1998 | Fujimoto | | 6,032,714 A | 3/2000 | Fenton |
| 5,773,951 A | 6/1998 | Markowski et al. | | 6,034,533 A | 3/2000 | Tervo et al. |
| 5,777,485 A | 7/1998 | Tanaka et al. | | 6,037,785 A | 3/2000 | Higgins |
| 5,792,668 A | 8/1998 | Fuller et al. | | 6,037,793 A | 3/2000 | Miyazawa et al. |

| | | | | | | |
|---|---|---|---|---|---|---|
| 6,043,667 | A | 3/2000 | Cadwallader et al. | 6,272,003 B1 * | 8/2001 | Schaper | 361/306.2 |
| 6,043,668 | A | 3/2000 | Carney | 6,275,738 B1 | 8/2001 | Kasevich et al. |
| 6,049,216 | A | 4/2000 | Yang et al. | 6,278,051 B1 | 8/2001 | Peabody |
| 6,051,422 | A | 4/2000 | Kovacs et al. | 6,278,411 B1 | 8/2001 | Ohlsson et al. |
| 6,052,653 | A | 4/2000 | Mazur et al. | 6,281,691 B1 | 8/2001 | Matsunaga et al. |
| 6,054,869 | A | 4/2000 | Hutton et al. | 6,284,971 B1 | 9/2001 | Atalar et al. |
| 6,060,888 | A | 5/2000 | Blackham et al. | 6,288,557 B1 | 9/2001 | Peters et al. |
| 6,060,891 | A | 5/2000 | Hembree et al. | 6,292,760 B1 | 9/2001 | Burns |
| 6,060,892 | A | 5/2000 | Yamagata | 6,300,775 B1 | 10/2001 | Peach et al. |
| 6,061,589 | A | 5/2000 | Bridges et al. | 6,307,672 B1 | 10/2001 | DeNure |
| 6,064,213 | A | 5/2000 | Khandros et al. | 6,310,483 B1 | 10/2001 | Taura et al. |
| 6,064,217 | A | 5/2000 | Smith | 6,310,755 B1 | 10/2001 | Kholodenko et al. |
| 6,064,218 | A | 5/2000 | Godfrey et al. | 6,313,567 B1 | 11/2001 | Maltabes et al. |
| 6,066,911 | A | 5/2000 | Lindemann et al. | 6,313,649 B2 | 11/2001 | Harwood et al. |
| 6,078,183 | A | 6/2000 | Cole, Jr. | 6,320,372 B1 | 11/2001 | Keller |
| 6,091,236 | A | 7/2000 | Piety et al. | 6,320,396 B1 | 11/2001 | Nikawa |
| 6,091,255 | A | 7/2000 | Godfrey | 6,327,034 B1 | 12/2001 | Hoover et al. |
| 6,096,567 | A | 8/2000 | Kaplan et al. | 6,335,625 B1 | 1/2002 | Bryant et al. |
| 6,100,815 | A | 8/2000 | Pailthorp | 6,335,628 B2 | 1/2002 | Schwindt et al. |
| 6,104,203 | A | 8/2000 | Costello et al. | 6,340,568 B2 | 1/2002 | Hefti |
| 6,104,206 | A | 8/2000 | Verkuil | 6,340,895 B1 | 1/2002 | Uher et al. |
| 6,106,148 | A * | 8/2000 | Moslehi et al. | 374/1 | 6,359,456 B1 | 3/2002 | Hembree et al. |
| 6,111,419 | A | 8/2000 | Lefever et al. | 6,362,636 B1 | 3/2002 | Peters et al. |
| 6,114,865 | A | 9/2000 | Lagowski et al. | 6,362,792 B1 | 3/2002 | Sawamura et al. |
| 6,118,287 | A | 9/2000 | Boll et al. | 6,366,247 B1 | 4/2002 | Sawamura et al. |
| 6,118,894 | A | 9/2000 | Schwartz et al. | 6,369,776 B1 | 4/2002 | Leisten et al. |
| 6,121,783 | A | 9/2000 | Horner et al. | 6,376,258 B2 | 4/2002 | Hefti |
| 6,124,723 | A | 9/2000 | Costello | 6,380,751 B2 | 4/2002 | Harwood et al. |
| 6,124,725 | A | 9/2000 | Sato | 6,384,614 B1 | 5/2002 | Hager et al. |
| 6,127,831 | A | 10/2000 | Khoury et al. | 6,395,480 B1 | 5/2002 | Hefti |
| 6,130,544 | A | 10/2000 | Strid et al. | 6,396,296 B1 | 5/2002 | Tartar et al. |
| 6,137,302 | A | 10/2000 | Schwindt | 6,396,298 B1 | 5/2002 | Young et al. |
| 6,137,303 | A | 10/2000 | Deckert et al. | 6,400,168 B2 | 6/2002 | Matsunaga et al. |
| 6,144,212 | A | 11/2000 | Mizuta | 6,404,213 B2 | 6/2002 | Noda |
| 6,146,908 | A * | 11/2000 | Falque et al. | 438/11 | 6,407,560 B1 | 6/2002 | Walraven et al. |
| 6,147,502 | A | 11/2000 | Fryer et al. | 6,407,562 B1 | 6/2002 | Whiteman |
| 6,147,851 | A | 11/2000 | Anderson | 6,409,724 B1 | 6/2002 | Penny et al. |
| 6,154,041 | A * | 11/2000 | Cheng | 324/762.05 | 6,413,868 B1 * | 7/2002 | Bartush et al. | 438/690 |
| 6,160,407 | A | 12/2000 | Nikawa | 6,414,478 B1 | 7/2002 | Suzuki |
| 6,161,294 | A | 12/2000 | Bland et al. | 6,415,858 B1 | 7/2002 | Getchel et al. |
| 6,166,553 | A | 12/2000 | Sinsheimer | 6,418,009 B1 | 7/2002 | Brunette |
| 6,169,410 | B1 | 1/2001 | Grace et al. | 6,420,722 B2 | 7/2002 | Moore et al. |
| 6,172,337 | B1 | 1/2001 | Johnsgard et al. | 6,423,981 B1 * | 7/2002 | Nayler | 257/48 |
| 6,175,228 | B1 | 1/2001 | Zamborelli et al. | 6,424,141 B1 | 7/2002 | Hollman |
| 6,181,144 | B1 | 1/2001 | Hembree et al. | 6,424,316 B1 | 7/2002 | Leisten et al. |
| 6,181,149 | B1 | 1/2001 | Godfrey et al. | 6,445,202 B1 | 9/2002 | Cowan et al. |
| 6,181,297 | B1 | 1/2001 | Leisten | 6,447,339 B1 | 9/2002 | Reed et al. |
| 6,181,416 | B1 | 1/2001 | Falk | 6,448,788 B1 | 9/2002 | Meaney et al. |
| 6,184,845 | B1 | 2/2001 | Leisten et al. | 6,458,611 B1 * | 10/2002 | Gardner | 438/17 |
| 6,191,596 | B1 | 2/2001 | Abiko | 6,459,739 B1 | 10/2002 | Vitenberg |
| 6,194,720 | B1 | 2/2001 | Li et al. | 6,466,046 B1 | 10/2002 | Maruyama et al. |
| 6,194,907 | B1 | 2/2001 | Kanao et al. | 6,468,816 B2 | 10/2002 | Hunter |
| 6,198,299 | B1 | 3/2001 | Hollman | 6,476,442 B1 | 11/2002 | Williams et al. |
| 6,211,663 | B1 | 4/2001 | Moulthrop et al. | 6,480,013 B1 | 11/2002 | Nayler et al. |
| 6,211,837 | B1 | 4/2001 | Crouch et al. | 6,481,939 B1 | 11/2002 | Gillespie et al. |
| 6,215,295 | B1 | 4/2001 | Smith, III | 6,483,327 B1 | 11/2002 | Bruce et al. |
| 6,222,031 | B1 | 4/2001 | Wakabayashi et al. | 6,483,336 B1 | 11/2002 | Harris et al. |
| 6,222,970 | B1 | 4/2001 | Wach et al. | 6,486,687 B2 | 11/2002 | Harwood et al. |
| 6,229,322 | B1 | 5/2001 | Hembree | 6,488,405 B1 | 12/2002 | Eppes et al. |
| 6,229,327 | B1 | 5/2001 | Boll et al. | 6,489,789 B2 | 12/2002 | Peters et al. |
| 6,232,787 | B1 | 5/2001 | Lo et al. | 6,490,471 B2 | 12/2002 | Svenson et al. |
| 6,232,788 | B1 | 5/2001 | Schwindt et al. | 6,492,822 B2 | 12/2002 | Schwindt et al. |
| 6,232,789 | B1 | 5/2001 | Schwindt | 6,501,289 B1 | 12/2002 | Takekoshi |
| 6,232,790 | B1 | 5/2001 | Bryan et al. | 6,512,391 B2 | 1/2003 | Cowan et al. |
| 6,233,613 | B1 | 5/2001 | Walker et al. | 6,512,482 B1 | 1/2003 | Nelson et al. |
| 6,236,223 | B1 | 5/2001 | Brady et al. | 6,515,494 B1 | 2/2003 | Low |
| 6,236,975 | B1 | 5/2001 | Boe et al. | 6,516,504 B2 * | 2/2003 | Schaper | 29/25.42 |
| 6,236,977 | B1 | 5/2001 | Verba et al. | 6,528,993 B1 | 3/2003 | Shin et al. |
| 6,239,590 | B1 * | 5/2001 | Krivy et al. | 324/158.1 | 6,529,844 B1 | 3/2003 | Kapetanic et al. |
| 6,242,929 | B1 | 6/2001 | Mizuta | 6,548,311 B1 | 4/2003 | Knoll |
| 6,245,692 | B1 | 6/2001 | Pearce et al. | 6,549,022 B1 | 4/2003 | Cole, Jr. et al. |
| 6,251,595 | B1 | 6/2001 | Gordon et al. | 6,549,026 B1 | 4/2003 | Dibattista et al. |
| 6,252,392 | B1 | 6/2001 | Peters | 6,549,106 B2 | 4/2003 | Martin |
| 6,257,319 | B1 | 7/2001 | Kainuma et al. | 6,566,079 B2 | 5/2003 | Hefti |
| 6,257,564 | B1 | 7/2001 | Avneri et al. | 6,573,702 B2 | 6/2003 | Marcuse et al. |
| 6,259,148 | B1 * | 7/2001 | Bartush et al. | 257/531 | 6,578,264 B1 | 6/2003 | Gleason et al. |
| 6,259,261 | B1 | 7/2001 | Engelking et al. | 6,580,283 B1 | 6/2003 | Carbone et al. |
| 6,265,950 | B1 | 7/2001 | Schmidt et al. | 6,582,979 B2 | 6/2003 | Coccioli et al. |
| 6,271,673 | B1 | 8/2001 | Furuta et al. | 6,587,327 B1 | 7/2003 | Devoe et al. |

| | | | |
|---|---|---|---|
| 6,603,322 B1 | 8/2003 | Boll et al. | |
| 6,605,951 B1 | 8/2003 | Cowan | |
| 6,605,955 B1 | 8/2003 | Costello et al. | |
| 6,608,494 B1 | 8/2003 | Bruce et al. | |
| 6,608,496 B1 | 8/2003 | Strid et al. | |
| 6,611,417 B2 | 8/2003 | Chen | |
| 6,617,862 B1 | 9/2003 | Bruce | |
| 6,621,082 B2 | 9/2003 | Morita et al. | |
| 6,624,891 B2 | 9/2003 | Marcus et al. | |
| 6,627,461 B2 | 9/2003 | Chapman et al. | |
| 6,628,503 B2 | 9/2003 | Sogard | |
| 6,628,980 B2 | 9/2003 | Atalar et al. | |
| 6,633,174 B1 | 10/2003 | Satya et al. | |
| 6,636,059 B2 | 10/2003 | Harwood et al. | |
| 6,636,182 B2 | 10/2003 | Mehltretter | |
| 6,639,415 B2 | 10/2003 | Peters et al. | |
| 6,639,461 B1 | 10/2003 | Tam et al. | |
| 6,639,491 B2 * | 10/2003 | Toncich | 333/125 |
| 6,642,732 B2 | 11/2003 | Cowan et al. | |
| 6,643,597 B1 | 11/2003 | Dunsmore | |
| 6,650,135 B1 | 11/2003 | Mautz et al. | |
| 6,653,903 B2 | 11/2003 | Leich et al. | |
| 6,657,214 B1 | 12/2003 | Foegelle et al. | |
| 6,657,601 B2 | 12/2003 | McLean | |
| 6,686,753 B1 | 2/2004 | Kitahata | |
| 6,701,265 B2 | 3/2004 | Hill et al. | |
| 6,707,548 B2 | 3/2004 | Kreimer et al. | |
| 6,710,798 B1 | 3/2004 | Hershel et al. | |
| 6,717,426 B2 | 4/2004 | Iwasaki | |
| 6,720,782 B2 | 4/2004 | Schwindt et al. | |
| 6,724,205 B1 | 4/2004 | Hayden et al. | |
| 6,724,928 B1 | 4/2004 | Davis | |
| 6,727,716 B1 | 4/2004 | Sharif | |
| 6,731,804 B1 | 5/2004 | Carrieri et al. | |
| 6,734,687 B1 | 5/2004 | Ishitani et al. | |
| 6,737,920 B2 | 5/2004 | Jen et al. | |
| 6,739,208 B2 | 5/2004 | Hyakudomi | |
| 6,744,268 B2 | 6/2004 | Hollman | |
| 6,753,679 B1 | 6/2004 | Kwong et al. | |
| 6,753,699 B2 | 6/2004 | Stockstad | |
| 6,756,751 B2 | 6/2004 | Hunter | |
| 6,768,328 B2 | 7/2004 | Self et al. | |
| 6,770,955 B1 | 8/2004 | Coccioli et al. | |
| 6,771,090 B2 | 8/2004 | Harris et al. | |
| 6,771,806 B1 | 8/2004 | Satya et al. | |
| 6,774,651 B1 | 8/2004 | Hembree | |
| 6,777,964 B2 | 8/2004 | Navratil et al. | |
| 6,778,140 B1 | 8/2004 | Yeh | |
| 6,784,679 B2 | 8/2004 | Sweet et al. | |
| 6,788,093 B2 | 9/2004 | Aitren et al. | |
| 6,789,236 B2 * | 9/2004 | Gardner | 716/136 |
| 6,791,344 B2 | 9/2004 | Cook et al. | |
| 6,794,888 B2 | 9/2004 | Kawaguchi et al. | |
| 6,794,950 B2 | 9/2004 | Du Toit et al. | |
| 6,798,226 B2 | 9/2004 | Altmann et al. | |
| 6,801,047 B2 | 10/2004 | Harwood et al. | |
| 6,804,807 B2 * | 10/2004 | Jamneala et al. | 324/755.01 |
| 6,806,724 B2 | 10/2004 | Hayden et al. | |
| 6,806,836 B2 | 10/2004 | Ogawa et al. | |
| 6,809,533 B1 * | 10/2004 | Anlage et al. | 324/750.02 |
| 6,812,718 B1 | 11/2004 | Chong et al. | |
| 6,815,947 B2 * | 11/2004 | Scheiner et al. | 324/230 |
| 6,822,463 B1 | 11/2004 | Jacobs | |
| 6,836,135 B2 | 12/2004 | Harris et al. | |
| 6,838,885 B2 | 1/2005 | Kamitani | |
| 6,842,024 B2 | 1/2005 | Peters et al. | |
| 6,843,024 B2 | 1/2005 | Nozaki et al. | |
| 6,847,219 B1 | 1/2005 | Lesher et al. | |
| 6,856,129 B2 | 2/2005 | Thomas et al. | |
| 6,861,856 B2 | 3/2005 | Dunklee et al. | |
| 6,864,694 B2 | 3/2005 | McTigue | |
| 6,873,167 B2 | 3/2005 | Goto et al. | |
| 6,878,964 B1 * | 4/2005 | Lien et al. | 257/48 |
| 6,885,197 B2 | 4/2005 | Harris et al. | |
| 6,900,646 B2 | 5/2005 | Kasukabe et al. | |
| 6,900,647 B2 | 5/2005 | Yoshida et al. | |
| 6,900,652 B2 | 5/2005 | Mazur | |
| 6,900,653 B2 | 5/2005 | Yu et al. | |
| 6,902,941 B2 | 6/2005 | Sun | |
| 6,903,563 B2 | 6/2005 | Yoshida et al. | |
| 6,914,244 B2 | 7/2005 | Alani | |
| 6,914,423 B2 * | 7/2005 | Nordgren et al. | 324/158.1 |
| 6,914,580 B2 | 7/2005 | Leisten | |
| 6,924,656 B2 | 8/2005 | Matsumoto | |
| 6,927,079 B1 | 8/2005 | Fyfield | |
| 6,937,341 B1 | 8/2005 | Woollam et al. | |
| 6,965,226 B2 | 11/2005 | Dunklee | |
| 6,970,001 B2 | 11/2005 | Chheda et al. | |
| 6,987,483 B2 | 1/2006 | Tran | |
| 7,001,785 B1 | 2/2006 | Chen | |
| 7,002,133 B2 | 2/2006 | Beausoleil et al. | |
| 7,002,363 B2 | 2/2006 | Mathieu | |
| 7,002,364 B2 | 2/2006 | Kang et al. | |
| 7,003,184 B2 | 2/2006 | Ronnekleiv et al. | |
| 7,005,842 B2 | 2/2006 | Fink et al. | |
| 7,005,868 B2 | 2/2006 | McTigue | |
| 7,005,879 B1 | 2/2006 | Robertazzi | |
| 7,006,046 B2 | 2/2006 | Aisenbrey | |
| 7,007,380 B2 | 3/2006 | Das et al. | |
| 7,009,188 B2 | 3/2006 | Wang | |
| 7,009,383 B2 | 3/2006 | Harwood et al. | |
| 7,009,415 B2 | 3/2006 | Kobayashi et al. | |
| 7,011,531 B2 | 3/2006 | Egitto et al. | |
| 7,012,425 B2 | 3/2006 | Shoji | |
| 7,012,441 B2 | 3/2006 | Chou et al. | |
| 7,013,221 B1 | 3/2006 | Friend et al. | |
| 7,014,499 B2 | 3/2006 | Yoon | |
| 7,015,455 B2 | 3/2006 | Mitsuoka et al. | |
| 7,015,689 B2 | 3/2006 | Kasajima et al. | |
| 7,015,690 B2 | 3/2006 | Wang et al. | |
| 7,015,703 B2 | 3/2006 | Hopkins et al. | |
| 7,015,707 B2 | 3/2006 | Cherian | |
| 7,015,708 B2 | 3/2006 | Beckous et al. | |
| 7,015,709 B2 | 3/2006 | Capps et al. | |
| 7,015,710 B2 | 3/2006 | Yoshida et al. | |
| 7,015,711 B2 | 3/2006 | Rothaug et al. | |
| 7,019,541 B2 | 3/2006 | Kittrell | |
| 7,019,544 B1 | 3/2006 | Jacobs et al. | |
| 7,019,701 B2 | 3/2006 | Ohno et al. | |
| 7,020,360 B2 | 3/2006 | Satomura et al. | |
| 7,020,363 B2 | 3/2006 | Johannessen | |
| 7,022,976 B1 | 4/2006 | Santana, Jr. et al. | |
| 7,022,985 B2 | 4/2006 | Knebel et al. | |
| 7,023,225 B2 | 4/2006 | Blackwood | |
| 7,023,226 B2 | 4/2006 | Okumura et al. | |
| 7,023,229 B2 | 4/2006 | Maesaki et al. | |
| 7,023,231 B2 | 4/2006 | Howland, Jr. et al. | |
| 7,025,628 B2 | 4/2006 | LaMeres et al. | |
| 7,026,832 B2 | 4/2006 | Chaya et al. | |
| 7,026,833 B2 | 4/2006 | Rincon et al. | |
| 7,026,834 B2 | 4/2006 | Hwang | |
| 7,026,835 B2 | 4/2006 | Farnworth et al. | |
| 7,030,599 B2 | 4/2006 | Douglas | |
| 7,030,827 B2 | 4/2006 | Mahler et al. | |
| 7,032,307 B2 | 4/2006 | Matsunaga et al. | |
| 7,034,553 B2 | 4/2006 | Gilboe | |
| 7,035,738 B2 | 4/2006 | Matsumoto et al. | |
| 7,068,049 B2 * | 6/2006 | Adamian | 324/638 |
| 7,088,981 B2 | 8/2006 | Chang | |
| 7,096,133 B1 | 8/2006 | Martin et al. | |
| 7,101,797 B2 | 9/2006 | Yuasa | |
| 7,138,813 B2 * | 11/2006 | Cowan et al. | 324/750.03 |
| 7,187,188 B2 | 3/2007 | Andrews et al. | |
| 7,188,037 B2 | 3/2007 | Hidehira | |
| 7,221,172 B2 | 5/2007 | Dunklee | |
| 7,250,626 B2 * | 7/2007 | Lesher | 257/48 |
| 7,250,779 B2 * | 7/2007 | Dunklee et al. | 324/754.03 |
| 7,283,694 B2 * | 10/2007 | Welch et al. | 385/14 |
| 7,352,168 B2 | 4/2008 | Dunklee | |
| 7,362,115 B2 | 4/2008 | Andrews et al. | |
| 7,423,419 B2 | 9/2008 | Dunklee | |
| 7,501,810 B2 | 3/2009 | Dunklee | |
| 7,514,915 B2 | 4/2009 | Dunklee | |
| 7,518,358 B2 | 4/2009 | Dunklee | |
| 7,554,322 B2 | 6/2009 | Nordgren et al. | |
| 7,589,518 B2 | 9/2009 | Schwindt et al. | |
| 7,595,632 B2 | 9/2009 | Harwood et al. | |
| 2001/0002794 A1 | 6/2001 | Draving et al. | |

| | | | |
|---|---|---|---|
| 2001/0009377 A1 | 7/2001 | Schwindt et al. | |
| 2001/0010468 A1 | 8/2001 | Gleason et al. | |
| 2001/0020283 A1 | 9/2001 | Sakaguchi | |
| 2001/0024116 A1 | 9/2001 | Draving | |
| 2001/0030549 A1 | 10/2001 | Gleason et al. | |
| 2001/0043073 A1 | 11/2001 | Montoya | |
| 2001/0044152 A1 | 11/2001 | Burnett | |
| 2001/0045511 A1 | 11/2001 | Moore et al. | |
| 2001/0054906 A1 | 12/2001 | Fujimura | |
| 2002/0005728 A1 | 1/2002 | Babson et al. | |
| 2002/0008533 A1 | 1/2002 | Ito et al. | |
| 2002/0009377 A1 | 1/2002 | Shafer | |
| 2002/0009378 A1 | 1/2002 | Obara | |
| 2002/0011859 A1 | 1/2002 | Smith et al. | |
| 2002/0011863 A1 | 1/2002 | Takahashi et al. | |
| 2002/0027434 A1* | 3/2002 | Nordgren et al. | 324/158.1 |
| 2002/0027763 A1* | 3/2002 | Schaper | 361/306.2 |
| 2002/0049554 A1* | 4/2002 | Miller | 702/104 |
| 2002/0050828 A1 | 5/2002 | Seward, IV et al. | |
| 2002/0066551 A1 | 6/2002 | Stone et al. | |
| 2002/0070743 A1 | 6/2002 | Felici et al. | |
| 2002/0070745 A1 | 6/2002 | Johnson et al. | |
| 2002/0075027 A1 | 6/2002 | Hollman et al. | |
| 2002/0075030 A1* | 6/2002 | Schittenhelm | 324/765 |
| 2002/0079911 A1 | 6/2002 | Schwindt | |
| 2002/0118009 A1 | 8/2002 | Hollman et al. | |
| 2002/0118034 A1 | 8/2002 | Laureanti | |
| 2002/0127744 A1* | 9/2002 | Gardner | 438/11 |
| 2002/0127748 A1* | 9/2002 | Gardner | 438/17 |
| 2002/0149377 A1 | 10/2002 | Hefti et al. | |
| 2002/0153909 A1 | 10/2002 | Petersen et al. | |
| 2002/0163769 A1 | 11/2002 | Brown | |
| 2002/0168659 A1 | 11/2002 | Hefti et al. | |
| 2002/0180466 A1 | 12/2002 | Hiramatsu et al. | |
| 2002/0197709 A1 | 12/2002 | Van der Weide et al. | |
| 2003/0010877 A1 | 1/2003 | Landreville et al. | |
| 2003/0030822 A1 | 2/2003 | Finarov | |
| 2003/0032000 A1 | 2/2003 | Liu et al. | |
| 2003/0040004 A1 | 2/2003 | Hefti et al. | |
| 2003/0057513 A1 | 3/2003 | Leedy | |
| 2003/0062915 A1 | 4/2003 | Arnold et al. | |
| 2003/0071631 A1 | 4/2003 | Alexander | |
| 2003/0072549 A1 | 4/2003 | Facer et al. | |
| 2003/0077649 A1 | 4/2003 | Cho et al. | |
| 2003/0088180 A1 | 5/2003 | Van Veen et al. | |
| 2003/0095737 A1* | 5/2003 | Welch et al. | 385/14 |
| 2003/0119057 A1 | 6/2003 | Gascoyne et al. | |
| 2003/0132759 A1* | 7/2003 | Tsironis | 324/601 |
| 2003/0139662 A1 | 7/2003 | Seidman | |
| 2003/0139790 A1 | 7/2003 | Ingle et al. | |
| 2003/0141861 A1 | 7/2003 | Navratil et al. | |
| 2003/0155939 A1 | 8/2003 | Lutz et al. | |
| 2003/0156270 A1 | 8/2003 | Hunter | |
| 2003/0170898 A1 | 9/2003 | Gundersen et al. | |
| 2003/0184332 A1 | 10/2003 | Tomimatsu et al. | |
| 2003/0210033 A1* | 11/2003 | Strid et al. | 324/158.1 |
| 2004/0015060 A1 | 1/2004 | Samsoondar et al. | |
| 2004/0016094 A1* | 1/2004 | Schaper | 29/25.42 |
| 2004/0021475 A1 | 2/2004 | Ito et al. | |
| 2004/0061514 A1 | 4/2004 | Schwindt et al. | |
| 2004/0066181 A1 | 4/2004 | Thies | |
| 2004/0067006 A1* | 4/2004 | Welch et al. | 385/14 |
| 2004/0069776 A1 | 4/2004 | Fagrell et al. | |
| 2004/0090223 A1 | 5/2004 | Yonezawa | |
| 2004/0095145 A1 | 5/2004 | Boudiaf et al. | |
| 2004/0095641 A1 | 5/2004 | Russum et al. | |
| 2004/0100276 A1 | 5/2004 | Fanton | |
| 2004/0100297 A1 | 5/2004 | Tanioka et al. | |
| 2004/0108847 A1 | 6/2004 | Stoll et al. | |
| 2004/0113639 A1 | 6/2004 | Dunklee et al. | |
| 2004/0113640 A1 | 6/2004 | Cooper et al. | |
| 2004/0130787 A1 | 7/2004 | Thome-Forster et al. | |
| 2004/0132222 A1 | 7/2004 | Hembree et al. | |
| 2004/0134899 A1 | 7/2004 | Hiramatsu et al. | |
| 2004/0138838 A1* | 7/2004 | Scheiner et al. | 702/64 |
| 2004/0147034 A1 | 7/2004 | Gore et al. | |
| 2004/0162689 A1 | 8/2004 | Jamneala et al. | |
| 2004/0175294 A1 | 9/2004 | Ellison et al. | |
| 2004/0186382 A1 | 9/2004 | Modell et al. | |
| 2004/0193382 A1 | 9/2004 | Adamian et al. | |
| 2004/0197771 A1 | 10/2004 | Powers et al. | |
| 2004/0199350 A1 | 10/2004 | Blackham et al. | |
| 2004/0207072 A1 | 10/2004 | Hiramatsu et al. | |
| 2004/0207424 A1 | 10/2004 | Hollman | |
| 2004/0239338 A1 | 12/2004 | Jonsson et al. | |
| 2004/0246004 A1 | 12/2004 | Heuermann | |
| 2004/0251922 A1 | 12/2004 | Martens et al. | |
| 2004/0267691 A1 | 12/2004 | Vasudeva | |
| 2005/0024069 A1 | 2/2005 | Hayden et al. | |
| 2005/0026276 A1 | 2/2005 | Chou | |
| 2005/0030047 A1* | 2/2005 | Adamian | 324/650 |
| 2005/0054029 A1 | 3/2005 | Tomimatsu et al. | |
| 2005/0062533 A1 | 3/2005 | Vice | |
| 2005/0067616 A1* | 3/2005 | Lien et al. | 257/48 |
| 2005/0083130 A1 | 4/2005 | Grilo | |
| 2005/0099192 A1 | 5/2005 | Dunklee et al. | |
| 2005/0101846 A1 | 5/2005 | Fine et al. | |
| 2005/0156675 A1 | 7/2005 | Rohde et al. | |
| 2005/0164160 A1 | 7/2005 | Gunter et al. | |
| 2005/0165316 A1 | 7/2005 | Lowery et al. | |
| 2005/0168722 A1 | 8/2005 | Forstner et al. | |
| 2005/0174191 A1 | 8/2005 | Brunker et al. | |
| 2005/0178980 A1 | 8/2005 | Skidmore et al. | |
| 2005/0195124 A1 | 9/2005 | Puente Baliarda et al. | |
| 2005/0227503 A1 | 10/2005 | Reitinger | |
| 2005/0236587 A1 | 10/2005 | Kodama et al. | |
| 2005/0237102 A1 | 10/2005 | Tanaka | |
| 2006/0052075 A1 | 3/2006 | Galivanche et al. | |
| 2006/0114012 A1 | 6/2006 | Reitinger | |
| 2006/0155270 A1 | 7/2006 | Hancock et al. | |
| 2006/0158207 A1 | 7/2006 | Reitinger | |
| 2006/0226864 A1 | 10/2006 | Kramer | |
| 2007/0024506 A1 | 2/2007 | Hardacker | |
| 2007/0030021 A1 | 2/2007 | Cowan et al. | |

FOREIGN PATENT DOCUMENTS

| | | |
|---|---|---|
| DE | 29 12 826 | 10/1980 |
| DE | 31 14 466 | 3/1982 |
| DE | 31 25 552 | 11/1982 |
| DE | 36 37 549 | 5/1988 |
| DE | 41 09 908 | 10/1992 |
| DE | 43 16 111 | 11/1994 |
| DE | 94 06 227 | 10/1995 |
| DE | 195 41 334 | 9/1996 |
| DE | 196 16 212 | 10/1996 |
| DE | 195 22 774 | 1/1997 |
| DE | 196 18 717 | 1/1998 |
| DE | 288 234 | 3/1999 |
| DE | 693 22 206 | 4/1999 |
| DE | 100 00 324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 | 5/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-011243 | 1/1987 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |

| | | |
|---|---|---|
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-8476 | 2/1993 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7-84003 | 3/1995 |
| JP | 7-273509 | 10/1995 |
| JP | 07273509 A * | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2001-358184 | 12/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL— A New concept in Microwave Measurements: Theory and Experimental Verification," IEEE Transactions on Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 20, 1982.
Signatone S-1240 Thermal Controller, 2 page description.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
The Micromanipulator Company, "Semi-Automatic Probing Stations and Accessories," pp. 1-12.
Integrated Technology Corporation, "Probilt PB500A Probe Card Repair and Analysis Station," 4 pages.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.
Eric Strid (Cascade Microtech), "Planar Impedance Standards and Accuracy Considerations in Vector Network Analysis," Jun. 1986, 8 pages.
J. Martens, Anritsu Company, 490 Jarvis Drive, Morgan Hill, CA 95037, "Multiport SOLR Calibrations: Performance and an Analysis of some Standards Dependencies," pp. 205-213.
Maury Microwave Corporation, "MT950 Series Transistor Test Fixture (TTF) Notice! Notice! Notice!," May 31, 1985.
Maury Microwave Corporation, MT950 Series Transistor Test Fixture (TTF), Oct. 7, 1982, 4 pages.
Temptronic Corporation, "Model TPO3000 Series ThermoChuck Systems for Probing, Characterization and Failure analysis of Wafers, Chips and Hybrids at High and Low Temperatures," pp. 2-5.
Cascade Microtech, "Model 42/42D Microwave Probe Station Instruction Manual, Electrical Operation," pp. 4-1-4-42.
Inter-Continental Microwave, "Microwave Semiconductor Chip Measurements using the HP 8510B TRL-Calibration Technique," Application Note: 101.
Design Technique, "Microstrip Microwave Test Fixture," May 1986, 2 pages.
Photo: Micromanipulator Probe Station 1994.
Micromanipulator Sales and Services Inc., "Test Station Accessories," Copyright 1983, 1984, 1 page.
Keithley Instruments, Inc. "Low-Level Measurements for Effective Low Current, Low Voltage, and High Impedance Measurements," Revised Third Edition, Printed Jun. 1984.
Inter-Continental Microwave, 2370-B Walsh Avenue, Santa Clara, CA 95051, "Product Catalog."
Hewlett Packard, "HP 4284A Precision LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
Temptronic, "Guarded" Chuck Sketch, Nov. 15, 1989.
Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.
William Knauer, "Fixturing for Low-Current/Low-Voltage Parametric Testing," Evaluation Engineering, Nov. 1990, pp. 9-12.
J.D.Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.
Cross Section—Signatone S-1240 Sketch, Advertised & Sold 1987-1988.
Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.
R.Y. Koyama & M. G. Buehler, "Semiconductor Measurement Technology: A Wafer Chuck for Use Between—196 and 350° C," U.S. Department of Commerce, National Technical Information Service, PB-293 298, Issued Jan. 1979.
Ken Cole, "ThermoChuck Performance (Fax)," 2 pages, Mar. 10, 1995.
S. Beck & E. Tomann, "Chip Tester," IBM Technical Disclosure Bulletin, Jan. 1985.
Applied Precision, "Checkpoint," 2 pages, 8505 SE 68th Street, Mercer Island, Washington 98040.
L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.
Daniel Van Der Weide, "THz Frequency Science & Technology Biomolecular Interaction Sensing with Sub-Terahertz Fields," University of Wisconsin-Madison, 2 pages.
Saswata Basu & Reed Gleason, "A Membrane Quadrant Probe for R&D Applications," Cascade Microtech, Inc. 14255 SW Brigadoon Ct., Beaverton, OR 97005, 3 pages.
The Micromanipulator Company, Inc., "Model 8000 Test Station," 1986, 1 page.
The Micromanipulator Company, Inc. "Model 8000 Test Station," 1988, 1 page.
"Vacuum," Mechanical Operation, pp. 3-8-3-9.
The Micromanipulator Company, Inc., "Accessories: Hot and Hot/Cold Chucks, Integrated Dry environments, Triaxial chucks, Integrated Shielded and Dark environments, Probe Card Holders," page 8.
Microwave Products, Microwave Journal, Sep. 1988, 1 page.
Cascade Microtech, "Advanced On-Wafer Device Characterization Using the Summit 10500," pp. 2-20.
Hewlett Packard, "HP 4142B Modular DC source/Monitor Practical Applications—High Speed DC Characterization of Semiconductor Devices from Sub pA to 1A," Nov. 1987, pp. 1-4.
Doug Rytting, "Appendix to an Analysis of Vector Measurement Accuracy Enhancement Techniques," pp. 1-42, Hewlett Packard.
Temptronic Corporation, "Application Note 1 Controlled Environment Enclosure for low temperature wafer probing in a moisture-free environment," 2 pages.
*Cascade Microtech, Inc.* vs. *Micromanipulator Company, Inc.*, "Deposition of Harry F. Applebay," United States District Court for the District of Oregon, Lead Case No. 97-479-AI.
Flexion Corporation, "Cryotest Station MP-3," *Cascade Microtech, Inc.* vs. *Micromanipulator Company, Inc.*, Applebay Exhibit 576, May 13, 1998, 68 pages.
Flexion Corporation, "Cryotest Station MP-3," *Cascade Microtech, Inc.* vs. *Micromanipulator Company, Inc.*, Applebay Exhibit 578, May 13, 1998, 1 page.
*Cascade Microtech, Inc.* vs. *Micromanipulator Company, Inc.*, Applebay Exhibit 572, May 13, 1998, 2 pages.
*Cascade Microtech, Inc.* vs. *Micromanipulator Company, Inc.*, Applebay Exhibits 581A, 581B, and 581C, May 13, 1998, 3 pages.
Flexion Corporation, "AP-1 Cryotest Station," Applebay Exhibit 582, May 13, 1998, 20 pages.
Flexion Corporation, "AP-1 Cryotest Station User Manual," Applebay Exhibit 583, May 13, 1998, 187 pages.
*Cascade Microtech, Inc.* vs.*Micromanipulator Company, Inc.*, Applebay Exhibits 577A, 577B, 577C, May 13, 1998, 3 pages.
*Cascade Microtech, Inc.* vs. *Micromanipulator Company, Inc.*, Applebay Exhibit 585, May 13, 1998, 7 pages.

* cited by examiner

S11 response of the short without resistive termination of the microstrip mode.

S11 response of the short with resistive termination of the microstrip mode.

PROBE TESTING STRUCTURE

CROSS-REFERENCE TO RELATED APPLICATIONS

This application is a continuation of U.S. patent application Ser. No. 10/794,246, filed Mar. 5, 2004, now U.S. Pat. No. 7,250,626; which application claims the benefit of U.S. Provisional App. No. 60/513,663, filed Oct. 22, 2003.

BACKGROUND OF THE INVENTION

The present invention relates to calibration structures for probing devices, and more particularly to improved calibration structures for suppressing undesirable electromagnetic modes resulting from the substrate of the calibration structure.

Coplanar transmission structures, such as coplanar waveguides, coplanar striplines, coplanar slotlines, and the like, are used in a wide variety of electronic applications. For example, coplanar waveguides are used in probes suitable to probe semiconductors at multi-gigahertz frequencies, such as described in U.S. Pat. No. 4,697,143. The probe described in the '143 patent has an approximately triangular shaped alumina substrate on which is formed a coplanar waveguide that tapers toward the point of the triangle. Bulk microwave absorbing material containing iron or ferrite and having a high magnetic loss coefficient is secured on both surfaces of the substrate to reduce the effect of unwanted propagation modes. One of these propagation modes includes energy that propagates up the probe substrate and reflects off of the probe mounting block and propagates back down the substrate producing undesired distortions of the measured signals.

Probes allow relatively accurate on-wafer measurements of very small devices, such as transistors, inductors, capacitors, resistors, and the like at frequencies from direct current to hundreds of giga-hertz. Relatively accurate measurements can be made using one or more such probes connected to a vector network analyzer and then calibrating the system using a calibration substrate. The calibration substrate has various types of planar calibration elements formed on it, such as Line-Reflect-Line (LRL) calibration elements, Line-Reflect-Match (LRM) calibration elements, Open-Short-Load-Thru (OSL-T) calibration elements, and the like. Deviations from the ideal response of the probe/calibration substrate combination are stored in the network analyzer and software algorithms are typically used to compensate for these detected deviations as well as the non-ideal response of the network analyzer and the interface to the probe.

The calibration substrate is positioned on a conductive chuck and is typically maintained in position by a vacuum. The conductive chuck acts as a ground plane for the undesired microstrip modes when a signal is applied through the probe. In addition to the undesired microstrip modes, undesirable surface wave modes propagate through the substrate. Quartz spacers have been placed under the calibration substrate to reduce the parasitic modes generated in the calibration substrate. However, even with quartz spacers the parasitic modes still produce resonances, such as in the incident to reflected signal ratio as measured by the network analyzer.

Unsuccessful attempts have been made to reduce the surface wave modes on the calibration substrate by locating a limited amount of lossy material, such as nichrome (nickel chromium alloy), along the opposing edges of the calibration elements. However, the dimension of the nichrome material is much shorter than the wavelength of the signal being coupled into the calibration element. Therefore, it has little effect on surface wave modes which propagate along the bottom surface of the substrate. Additionally, it has little effect on the microstrip modes generated by the conductive chuck acting as a ground plane for the calibration elements.

Referring to FIG. 1, a cross-sectional view of the coplanar transmission structure 10 described in U.S. Pat. No. 5,225,796 is shown. The coplanar transmission structure 10 includes a substrate 12 having a coplanar transmission line 14, shown as a coplanar transmission waveguide, formed on one surface thereof. The substrate 12 is formed from a dielectric material, such as alumina or sapphire. The coplanar transmission line 14 may also be a coplanar stripline, as in FIG. 2. The coplanar transmission waveguide 14 includes a center strip 16 with two ground planes 18 and 20 located parallel to and in the plane of the center strip 16. The coplanar transmission line 14 defines the electromagnetic mode of radiation propagating along the transmission line 14, such as a quasi-TEM mode of propagation. The opposite surface of the substrate 12 has a layer of lossy resistive material 22, such as nichrome, tantalum nitride, or the like formed thereon.

The use of a lossy resistive material tends to attenuate the parasitic evanescent or propagating electromagnetic modes of the coplanar transmission structure. FIG. 2A shows a plan view of a coplanar transmission structure having an asymmetrical coplanar stripline 24 formed on one surface of a sapphire substrate 26. A layer of nichrome 28 is deposited adjacent and connected to the ground of the stripline 27. The cross-sectional view of FIG. 2B shows another approach to adding lossy material, with the layer of nichrome 30 formed on the opposite surface of the substrate 26.

Unfortunately, the structures shown in FIGS. 1 and 2 tend to result in relatively distorted signals over a large range of frequencies. The distortion results from undesirable modes propagating within the substrate. The precise source of the undesirable modes is unknown which results in difficulty in reducing the undesirable modes. The distortion levels are sufficiently large that for very accurate measurements the calibration substrate is simply ineffective.

A calibration substrate available from Cascade Microtech of Beaverton, Oreg. includes a set of calibration structures. Referring to FIG. 3, the calibration structures include a set of conductive members 54 supported by the substrate and spatially arranged across the substrate. Similar conductive members are aligned in an array orientation. To effectively increase the frequency response and smooth out the frequency response of the microstrip mode of the conductive members to the base of the substrate, a small portion of resistive material 56 is located adjacent to the end of each of the conductive members. The wider conductive members are approximately 525 microns wide and the thinner conductive members are approximately 100 microns wide, with a spacing of approximately 750 microns between conductive material columns. The resistive material is approximately 150 microns in length and has a width equal to that of the conductive material. The conductive members are approximately 1400 microns in length. The column of conductive members 60 are for open calibration tests, the column of conductive member 62 are for load calibration tests, the column of conductive members 64 are for short calibration tests, the column of conductive members 66 are for through conductive tests, and the column of conductive members 68 are for loop back through conductive tests.

While providing an improved measurement accuracy, the resulting structure includes a resonance at approximately 33 giga-hertz having a magnitude of approximately 0.10-0.15 dB deviation from the ideal (0 dB) when measuring a short calibration structure (S11 measurement), as shown in FIG. 4.

The S11 magnitude in dB is calculated as 20*log(x), where x is the magnitude of the return signal with the input normalized to 1. This resonance makes probing of semiconductors more difficult in the general range of 33 giga-hertz because it is difficult to calibrate the system. In the case of a resonant system, Q is a measure of the sharpness of the resonant peak in the frequency response of the system and is inversely proportional to the damping in the system, and may be also considered the reactive portion over the resistive portion of the impedance causing the resonance. For example, Q=(center frequency in hertz)/(bandwidth (0.707 times down (3 dB reduction in magnitude) from the maximum magnitude at the center frequency)). Referring to FIG. 4, the Q factor of the impedance causing the 33 GHz resonance is approximately 22.

What is desired is calibration structures that reduce unwanted spurious modes.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 5:
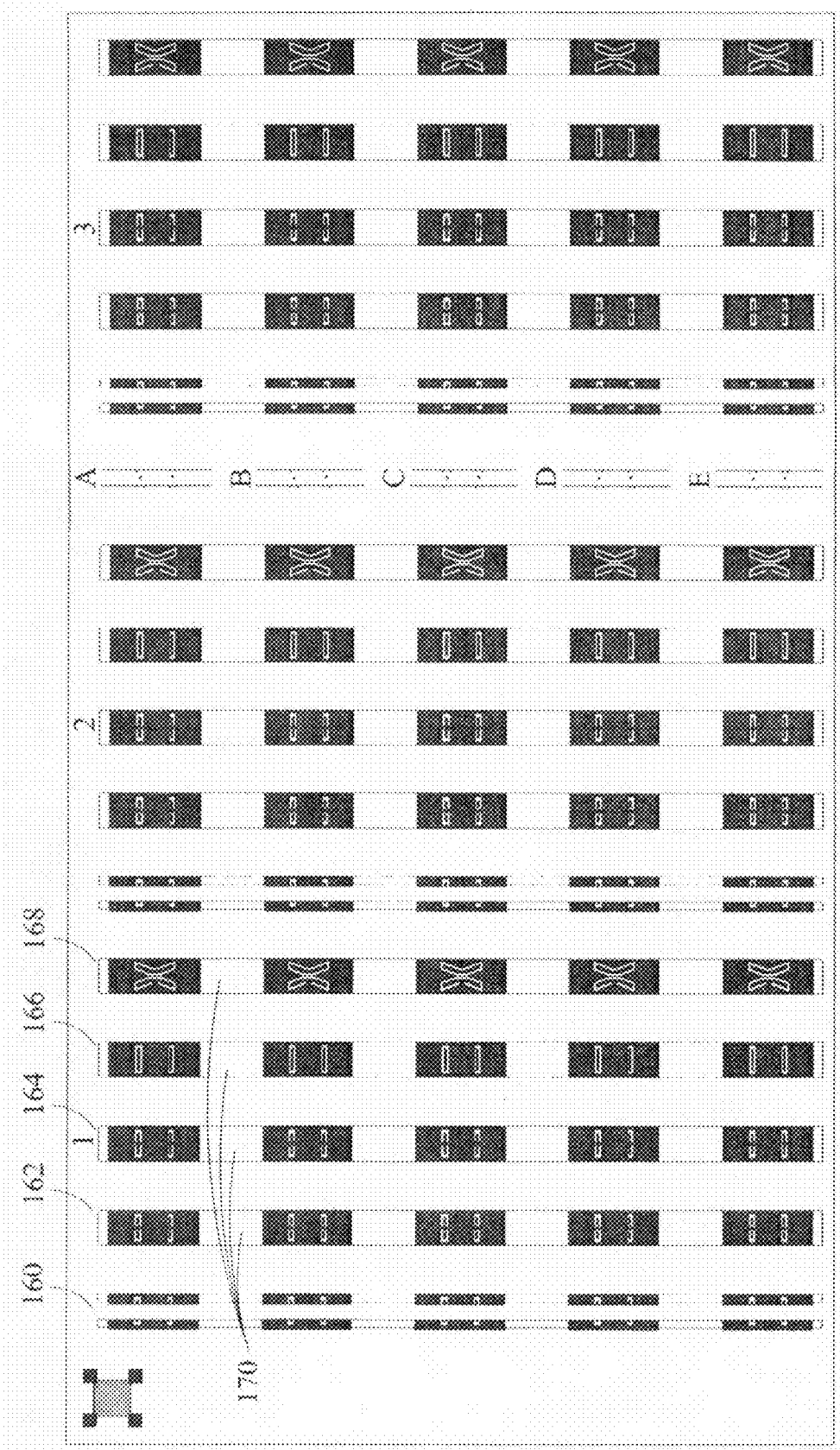
FIG. 5 illustrates a modified calibration substrate.

Referring to FIG. 5, a calibration substrate that includes one or more conductive members is illustrated. The structures on the calibration substrate are modeled by the manufacturer with some degree of accuracy so that the probe, network analyzer, and cabling between the probe and network analyzer can be accurately modeled with some degree of precision.

Figures 6A, 6B, 6C:
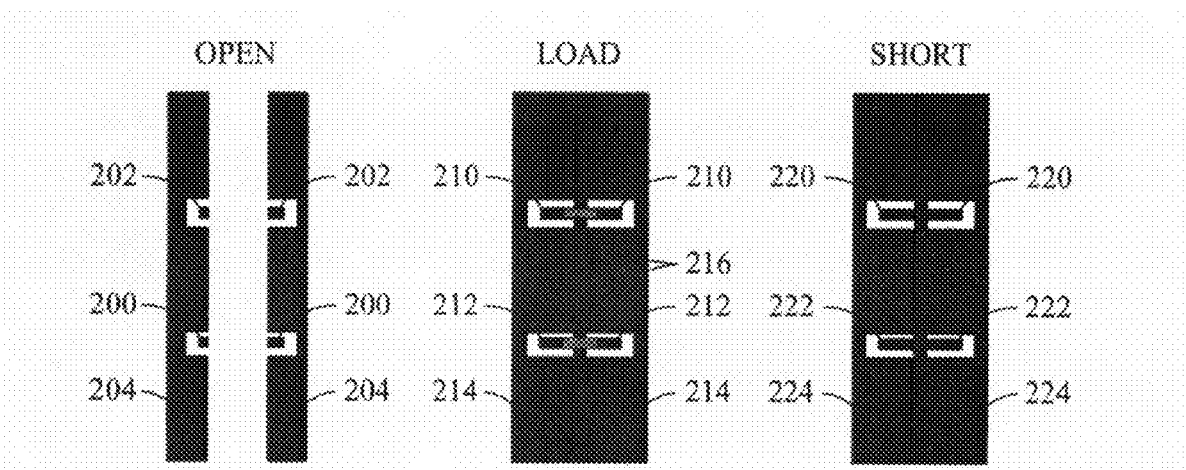
FIGS. 6A-6E illustrate calibration regions.
Figures 6D, 6E:
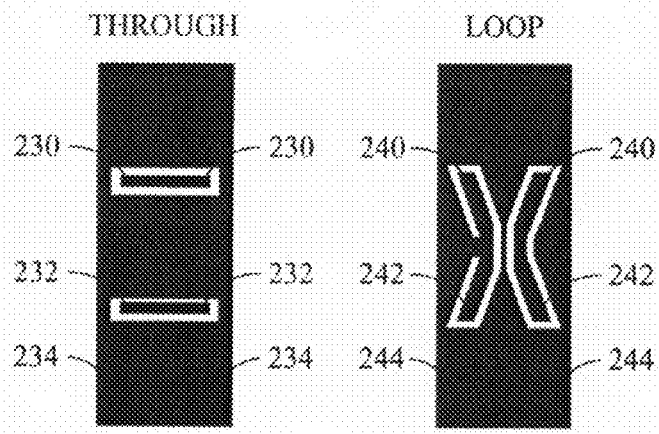

The preferred dimensions include the wider conductive members being approximately 525 microns wide and the thinner conducive members being approximately 100 microns wide. The length of the conductors are preferably 1400 microns. The column of conductive members 160 are for open calibration tests, the column of conductive member 162 are for load calibration tests, the column of conductive members 164 are for short calibration tests, the column of conductive members 166 are for through conductive tests, and the column of conductive members 168 are for loop back through conductive tests. In general, the signal paths are located on the small conductive regions within each larger conductive region. Similarly, in general the ground paths are located on the larger conductive regions. In some cases, the signal and ground conductive portions are tied together. Referring to FIG. 6A, for example, the open conductive test 160 for a dual path test includes a pair of signal conductive regions 200 and 202, and a ground conductive region 204. Referring to FIG. 6B, for example, the load conductive test 162 for a dual path test includes a pair of signal conductive regions 210 and 212, and a ground conductive region 214, where the respective conductive regions 210 and 212 are interconnected by a resistive material 216, such as a 50 ohm/square resistive material. Referring to FIG. 6C, for example, the short conductive test 164 for a dual path test includes a pair of signal conductive regions 220 and 222, and a ground conductive region 224 which is electrically connected to the signal conductive regions 220 and 222. Referring to FIG. 6D, for example, the through conductive test 166 for a dual path test includes a pair of signal conductive regions 230 and 232, and a ground conductive region 234. Referring to FIG. 6E, for example, the loop back conductive test 168 for a dual path test includes a pair of signal conductive regions 240 and 242, and a ground conductive region 244.

The calibration may include any suitable technique, such as for example, line-reflect-match, short-open-load, through-reflect line, line-reflect-reflect-match, short-open-load-through, and short-open-load-reciprocal. Deviations from the ideal response of the probe/calibration substrate combination are stored in the network analyzer and software algorithms may be used to compensate for these detected deviations as well as the non-ideal response of the network analyzer and the interface to the probe.

Figure 1:
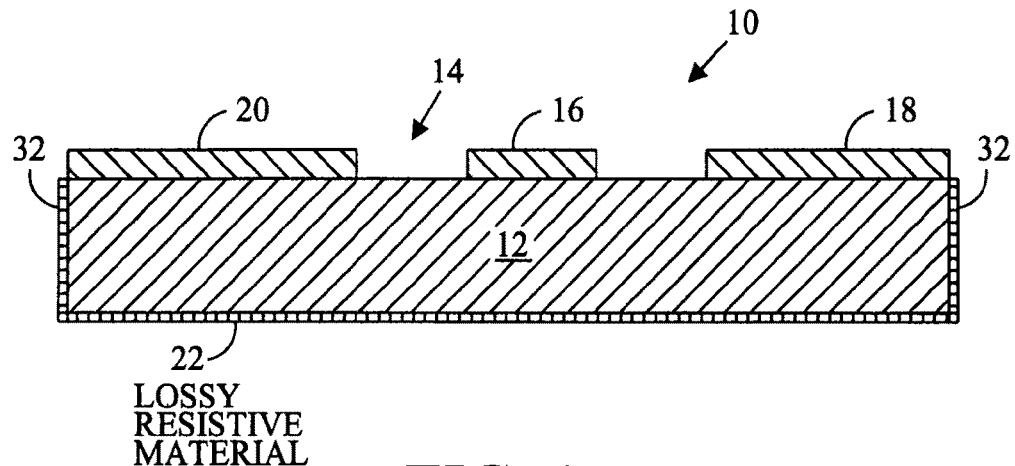
FIG. 1 is a cross-sectional view of a coplanar transmission structure.
Figure 2A:
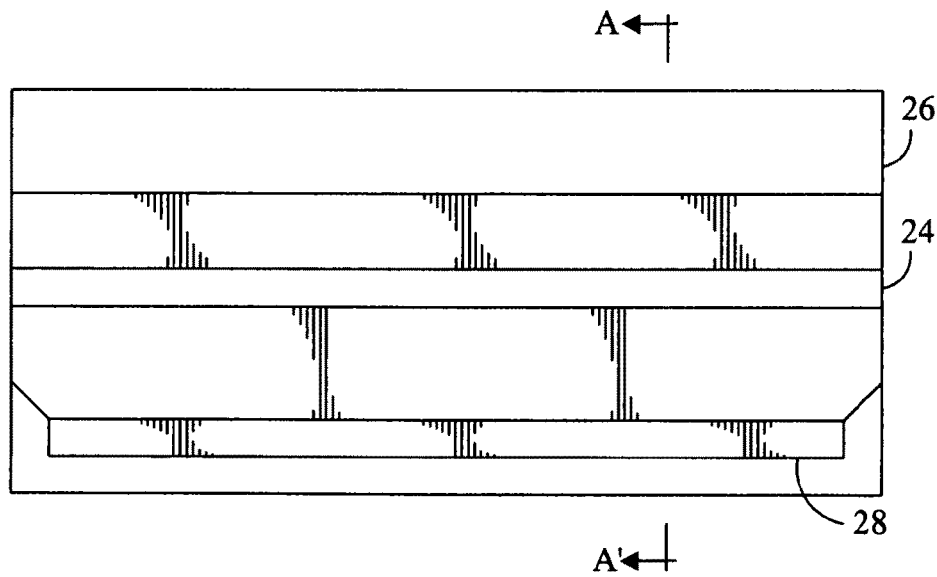
FIGS. 2A-B are plan and cross-sectional views of coplanar stripline cases incorporating resistive layers.
Figure 2B:
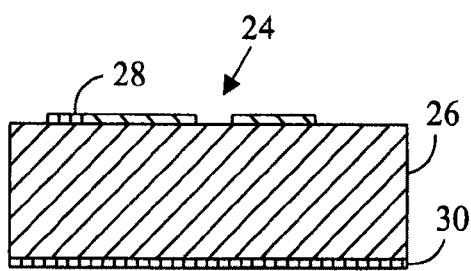
Figure 3:
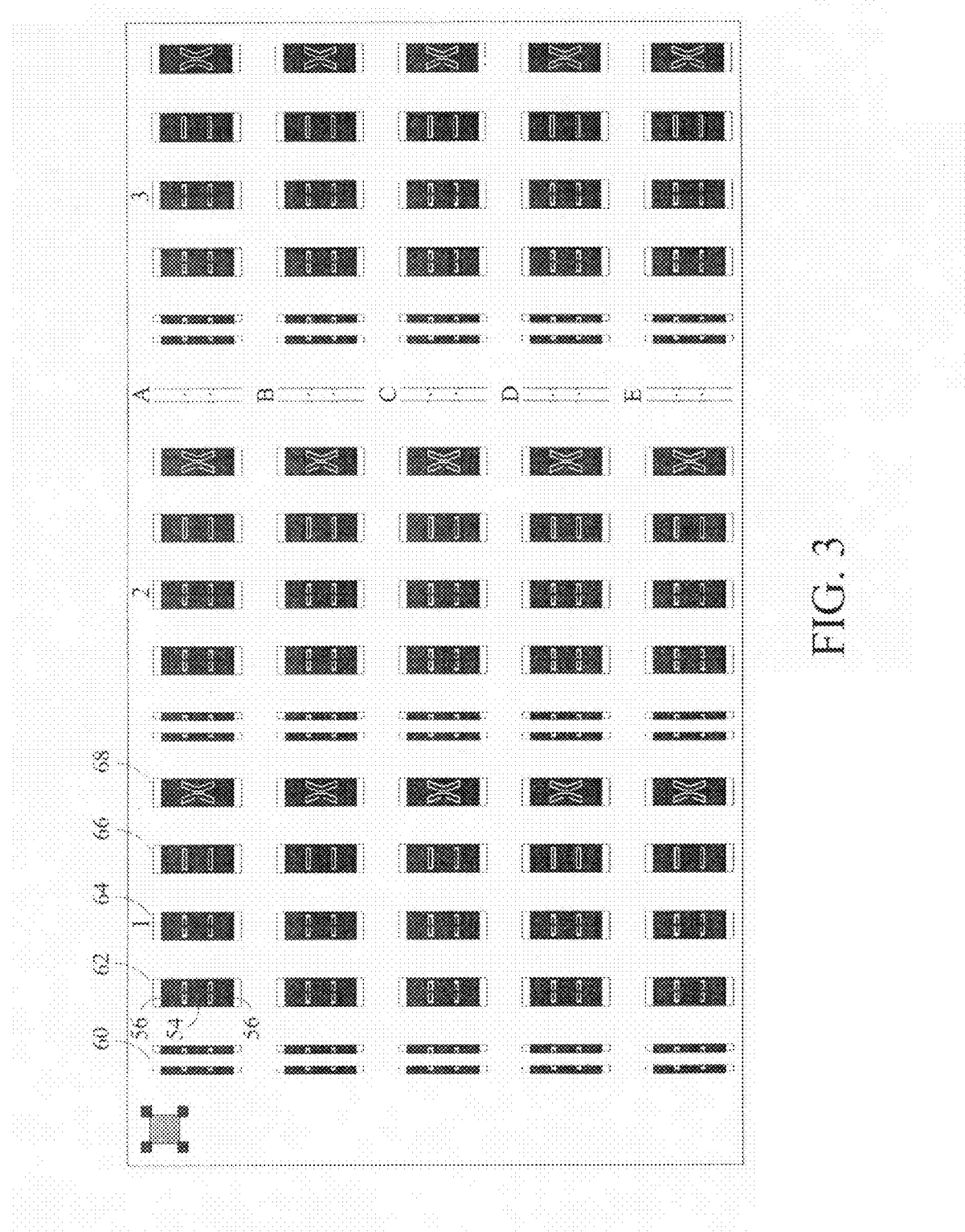
FIG. 3 illustrates an existing calibration substrate.
Figure 4:
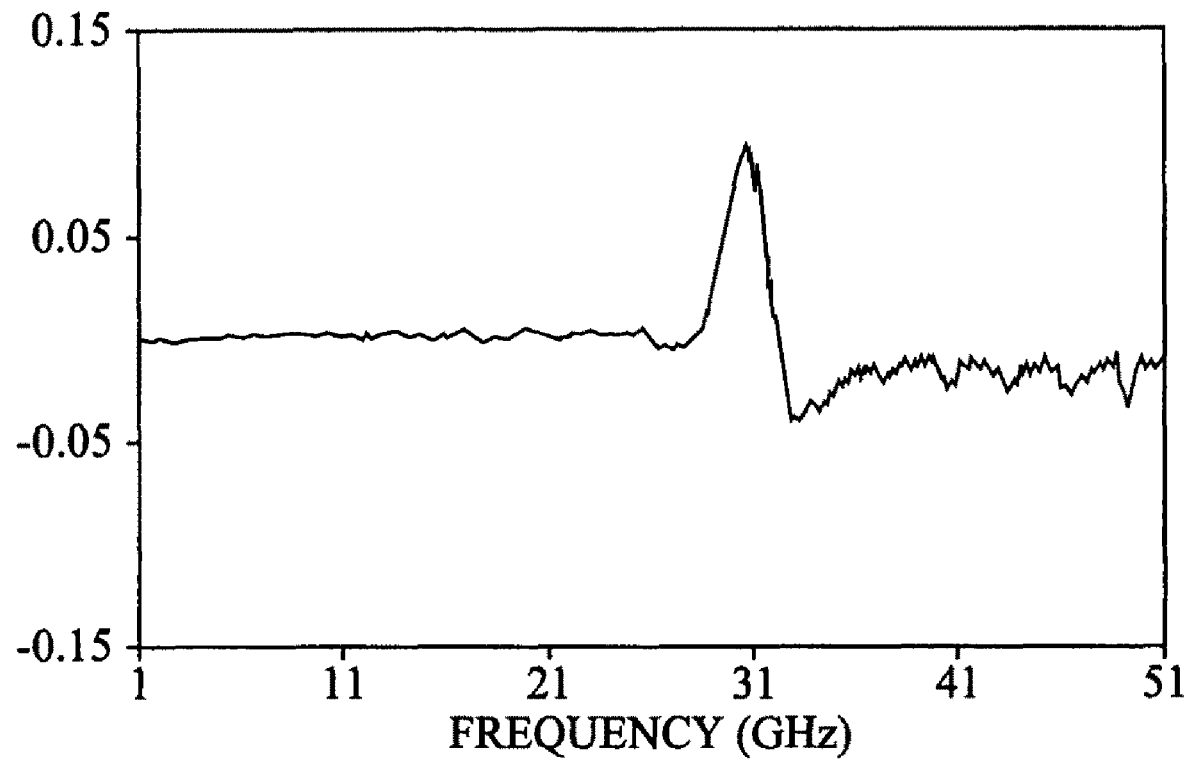
FIG. 4 illustrates S11 response of a short without resistive termination of the microstrip mode.
Figure 7:
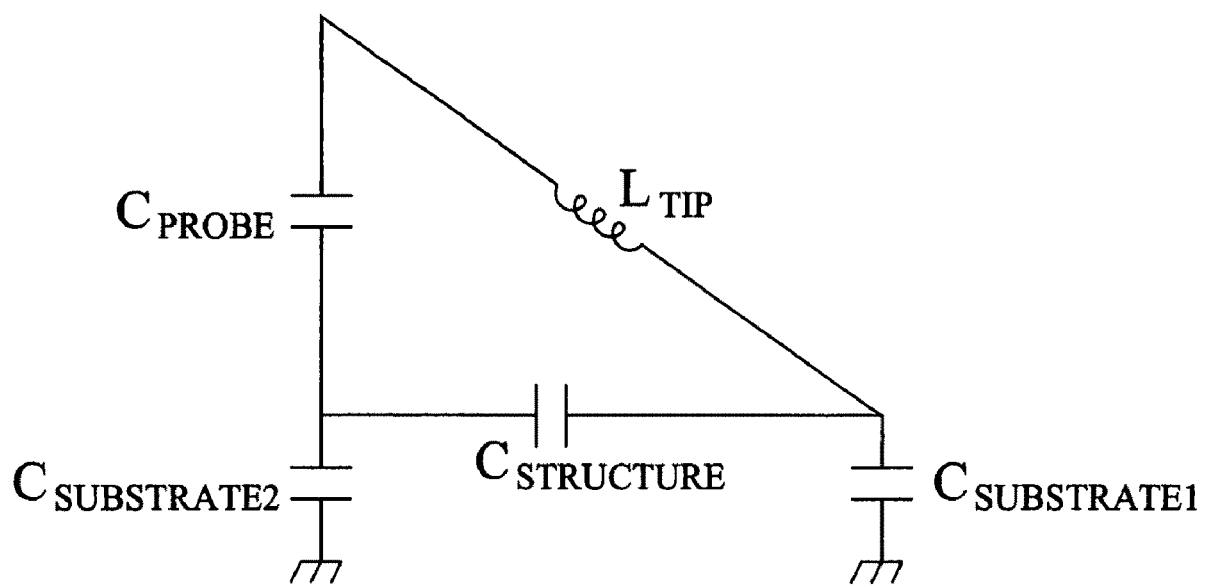
FIG. 7 illustrates a LC circuit.

The present inventor considered the effects of the resonance frequency occurring at approximately 33 GHz for the structure shown in FIG. 3. The present inventor speculated that one potential explanation for the observed effect is that there exists a significant capacitance "$C_{structure}$" between adjacent columns of calibration resistor/conductor/resistor structures. In addition, during the calibration process there exists another significant capacitance "$C_{probe}$" between the probe itself and the adjacent calibration structure to the one being tested. Further, during the calibration process the ground path of the probe tip has a significant inductance $L_{tip}$. As illustrated in FIG. 7, the resulting pair of capacitances $C_{structure}$ and $C_{probe}$ together with the inductance $L_{tip}$ result in a inductor-capacitor (LC) resonance structure.

This LC resonance structure varies by including additional probe tip inductance and additional mutual inductance between the probe tips when the substrate is used for calibration of a dual (or more) signal path probe. For example, the probe may include a ground/signal/ground/signal/ground structure where the pair of signal paths may be located on different conductive members during calibration. The substrate may likewise be used for single port calibrations between a pair of probes or for a single probe or one to multiple ports. Further, in most cases the signal lines may be used for input or output or both.

The recognition of the existence of the capacitance between different conductive portions of the substrate provides insight into one potential source of the undesirable distortion. To modify the distortion, one technique may be to space the conductive members at locations further distant from one another. This results in a decrease in the capacitance between the conductive members. As the capacitance between the conductive members is decreased the resonance frequency of the effective LC circuit is increased. With sufficient increase in the resonance frequency, the resonance may occur at a frequency that is not of interest during measurement, such as above 200 giga-hertz. Unfortunately, increasing the spacing between the conductive members results in fewer calibration structures on the substrate, which become worn after repeated use.

Another resonance can occur from the length and width of the ground conductor approaching a half-wavelength at the frequencies of interest. In this case, $C_{probe}$ and $C_{structure}$ additionally couple to such resonators, which can further distort the desired signals.

Figure 8:
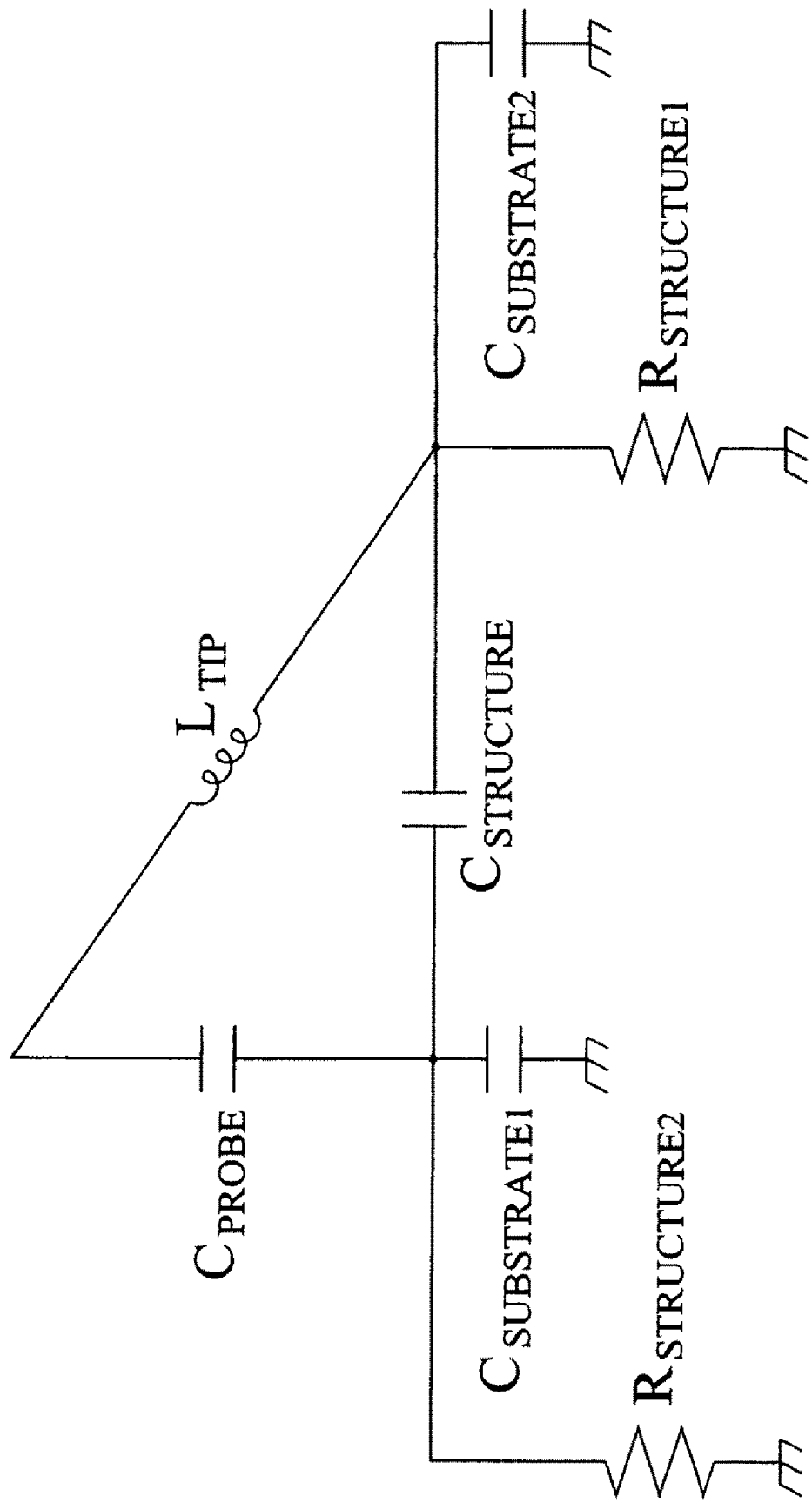
FIG. 8 illustrates a LCR circuit.
Figure 9:
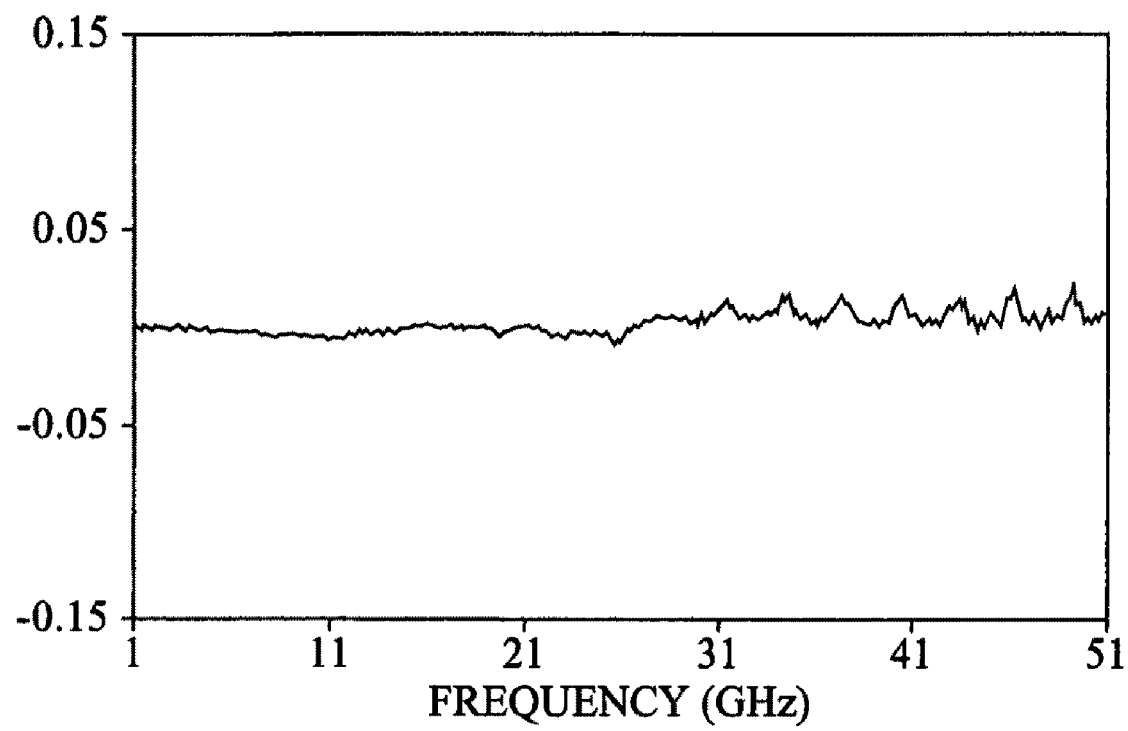
FIG. 9 illustrates S11 response of a short with resistive termination of the microstrip mode.

To provide a more suitable calibration substrate while reducing the resonances identified, the present inventor came to the realization that a resistive element 170 should be included in the LC circuit to effectively provide an LCR circuit, as illustrated in FIG. 8. The additional resistive element $R_{structure}$ is sufficient to dampen the resonance aspects of the structure to a sufficiently small level. In the preferred structure, the resistive element interconnects the two adjacent conductive elements. Measurements resulting from the modified structure show a deviation from ideal of less than 0.02 dB in a measurement of the short structure (S11 measurement). In contrast, the previously existing structures that included resistive material did not have a sufficiently wide resistor area to reduce the resonance(s), whatever their origin. The present inventor speculates that the narrow resistors of existing structures provide insufficient capacitance between the resistor material to the ground plane such that little current flows in the resistor material, thus resulting in a relatively high Q. Accordingly, the present inventor speculates that with additional resistor material or additional resistance sufficient capacitance exists between the resistive material and the ground plane so that sufficient current flows in the resistive material thus lowering the Q of the resonator structure created by the ground conductor.

The modified structure has a characteristic that was previously unobtainable with a loss of less than 0.05 dB between 5 GHz and 100 GHz, and more preferably between 10 GHz and 70 GHz, more preferably between 20 and 60 GHz, more preferably between 30 GHz and 50 GHz, or and more preferably a loss of less than 0.025 dB between these ranges (S11 measurement). This measurement may be characterized as the vector difference between the structure's S11 and the S11 of a relatively trusted short or open. Further, the modified structure permits the Q of the resonance to be substantially reduced, such as to a value less than 5, more preferably less than 3, more preferably less than 2, and more preferably less than approximately 1. While the resistive material is preferably connected to both of the conductive materials and extends the entire distance between the conductive materials, less resistive material may likewise be used, if desired. For example, the resistive material may extend at least 50% of the distance between the conductive members, more preferably at least 75% of the distance between the conductive members, more preferably at least 90% of the distance between the conductive members, and more preferably at least 95% of the distance between the conductive members. Furthermore, resistive material may be included between the columns of conductive materials and extend the entire distance between the conductive materials. Also, less resistive material may be included between the columns of conductive materials, if desired, and more preferably between the conductive materials. For example, the resistive material may extend at least 50% of the distance between the conductive members, more preferably at least 75% of the distance between the conductive members, more preferably at least 90% of the distance between the conductive members, and more preferably at least 95% of the distance between the conductive members.

Figure 10:
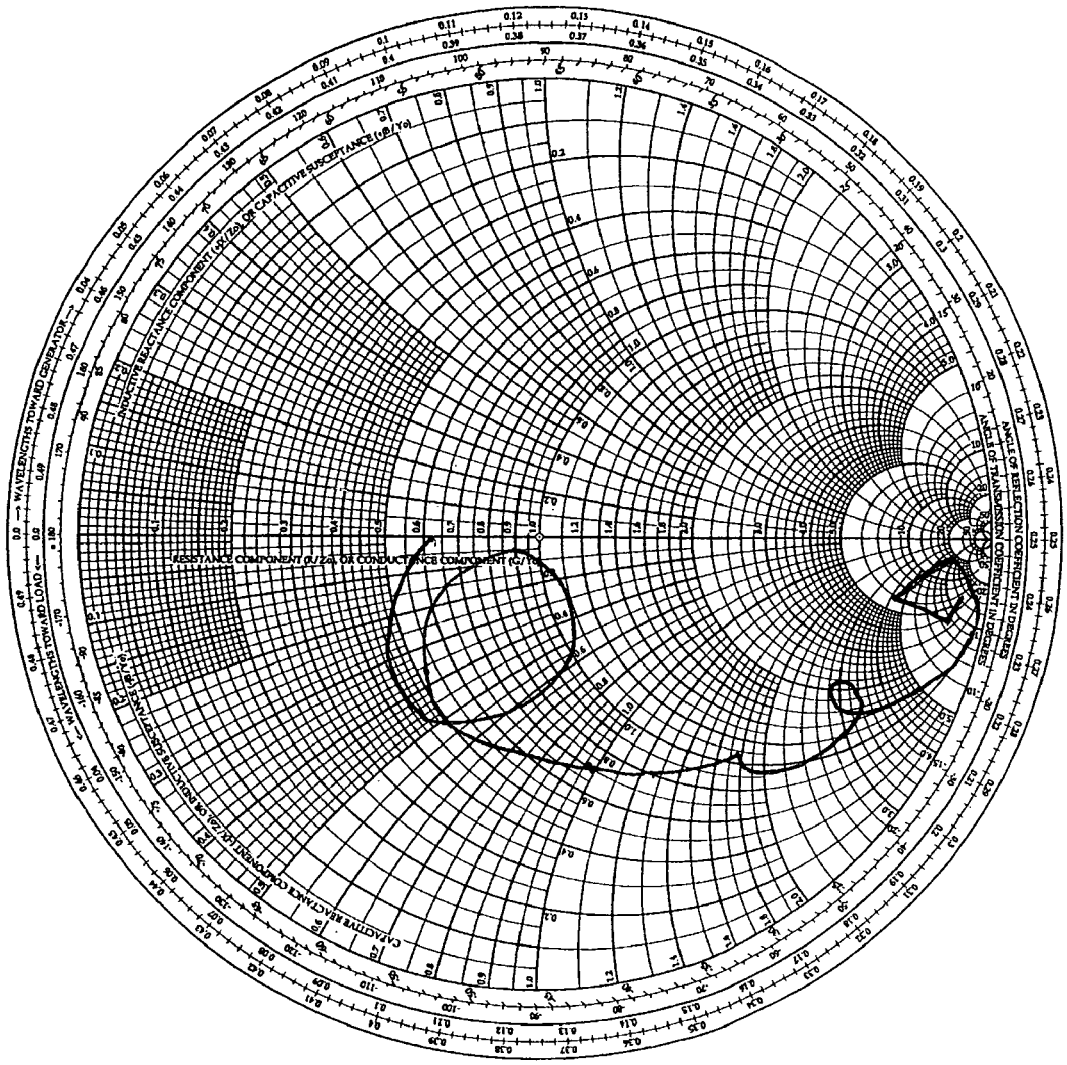
FIG. 10 illustrates a smith chart of the impedance matches of the probe impedance without resistive material.
Figure 11:
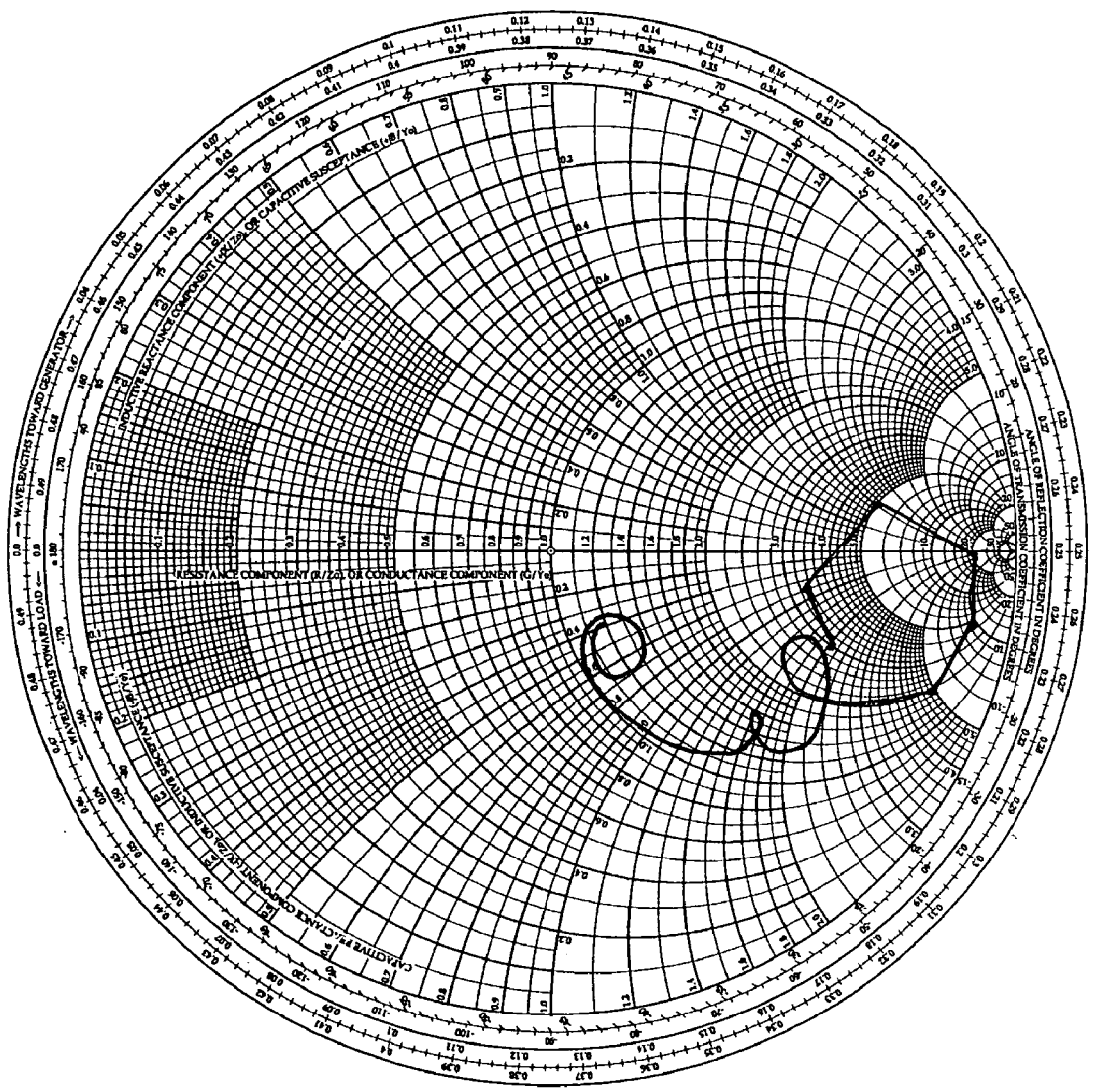
FIG. 11 illustrates a smith chart of the impedance matches of the probe impedance with limited resistive material.

By way of illustration, a test was performed without additional resistive material and an indication of the conductive member resonance seems to occur when the impedance matches the probe and system impedance around 22 GHz and 52 GHz, as illustrated in FIG. 10. In addition, at 33 GHz, the resonance is observed while probing the short on a conductive member. With adjacent resistors having a resistance of approximately 60 ohms the reactive part of the impedance of 60-j60 at approximately 33 GHz is generally matched, as illustrated in FIG. 11. The present inventor speculated that another potential source of this effect is that the additional resistive material, as shown in FIG. 5, in effect substantially matches the imaginary part (within 10%) of the mode conversion at that frequency to reduce or otherwise eliminate the resonance.

The present inventor, based upon the aforementioned observation, considered that during the calibration process the probe maintains a signal primarily in a single mode, such as CPW mode (coplanar waveguide). The signal propagating in the CPW mode is imposed on the calibration substrate. The majority of the signal is maintained in the CPW mode by the calibration substrate. However, a portion of the signal in the CPW mode is converted by the calibration structures into other modes, such as a microstrip mode between the conductive members and the bottom of the substrate. At particular frequencies for particular configurations, this mode conversion from CPW to microstrip is substantial, such as 33 GHz as previously discussed. Accordingly, one explanation of the beneficial effects of the resistor material is that it is terminating the microstrip mode in a resistance substantially equal to its characteristic impedance. If not connected to other conductors, the resistor area should be wide enough to create sufficient capacitance to the ground plane to cause the ground conductor to see an impedance substantially equal to the characteristic impedance of the undesired mode (within +/−25 percent, more preferably within +/−10 percent). The resistive material preferably has a resistance that is within +/−25 percent, more preferably within +/−10 percent, of the characteristic impedance of the microstrip mode. Also, the length of the resistive material is preferably sufficient to provide an impedance substantially equal to the characteristic impedance of the undesired mode, preferably within +/−10 percent, and preferably within +/−25 percent. Also, the area of the resistive material is preferably sufficient to provide an impedance substantially equal to the characteristic impedance of the undesired mode, preferably within +/−10 percent, and preferably within +/−25 percent. The thickness of the substrate and/or its dielectric constant is preferably sufficient such that the conductive region (ground conductor and/or signal conductor(s)) and/or resistive material has an impedance substantially equal to the characteristic impedance of the undesired mode, preferably within +/−10 percent, and preferably within +/−25 percent.

In many cases the characteristic impedance of the microstrip mode to the ground plane is related to the ratio of the width of the microstrip (resistor and/or conductive region (ground conductor and/or signal conductor(s)) to the substrate thickness. Therefore, the resistive material may be considered as a very lossy microstrip line of similar impedance which preferably has a length substantially the same as the length of the ground conductor, within +/−10 percent, within +/−25 percent, within +/−50 percent, within +/−75 percent. If the resistive element is considered as a series of lumped elements, a longer resistive structure has more capacitance to the ground plane, thus providing a termination resistor.

In other embodiments, the resistive material may be of a length greater than 300 microns, more preferably greater than 500 microns, and more preferably greater than 750 microns. The resistive material may likewise have the same width as the conductive region, or within 75% of the same width. Also, the resistive material may be characterized as having a total resistance (per side) of more than 40 ohms, more preferably more than 45 ohms, more preferably more than 50 ohms, and more preferably more than 55 ohms. Furthermore, the S11 characteristics, Q value characteristics, resistive material characteristics, and reactive characteristics may be related to a single combination of a conductive member and resistive material without relation to other conductive members or other resistive members.

The relationships described herein may be considered as is without regard to the type of resistive material used. Also, the relationships described herein are preferably for a resistive material of approximately 50 ohms/square (within +/−5 percent, within +/−10 percent, within +/−25 percent). However, if the resistance of the resistive material is other than 50 ohms/square then the width of the conductive region (ground conductors and/or signal conductors) and/or resistive material, thickness of the substrate, dielectric constant of the substrate, length of the conductive region (ground conductors and/or signal conductors) and/or resistive material, may be modified to maintain the same ratios and/or the same characteristic impedance matching.

The substrate may include microwave absorbing material between the substrate and the chuck, if desired. Further, microwave absorbing material may be located on the sides and/or the top surface of the substrate, if desired. Also, the chuck may be, for example, conductive, non-conductive, lossy, supporting an upper dielectric layer, supporting an upper microwave absorbing material. In addition, the characteristics of the resistive material may likewise be included with conductive regions on a calibration substrates for a single channel, such as merely a ground region and a signal region.

The resistive material may have different sheet resistances to match different application needs depending on the characteristic impedance of the device under test. Additionally patterning of the lossy material in various shapes may be chosen to meet specific application needs.

Figure 12:
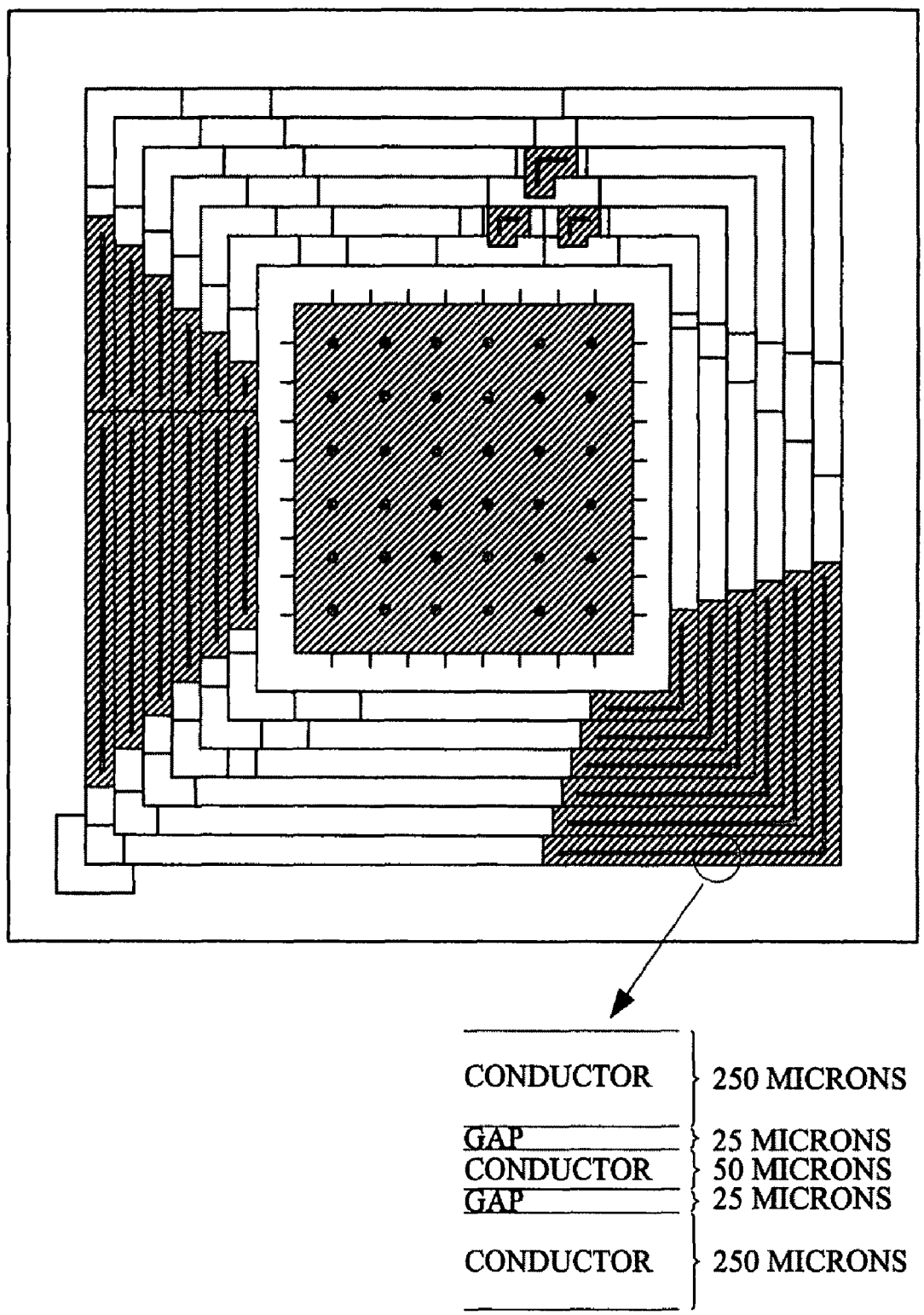
FIG. 12 illustrates another calibration structure.

Another calibration structure is shown in FIG. 12 suitable for membrane type probes available from Cascade Microtech, Inc. of Beaverton, Oreg. The structure includes conductive regions, such as elongate ground conductors with a signal conductor between a pair of ground conductors separated by a gap or dielectric material. The conductive regions are preferably spaced apart by gaps or dielectric material. Between different conductive regions may be dielectric or resistive material. The central region includes a large conductive region and individual pads for the probing contacts which may be electrically isolated form the large conductive region.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A calibration substrate for calibrating a probe comprising:
   (a) a planar first conductive member supported by said substrate suitable to be electrically interconnected with a first signal path of said probe;
   (b) a planar second conductive member supported by said substrate suitable to be electrically interconnected with a second signal path of said probe;
   (c) a planar third conductive member supported by said substrate suitable to be electrically interconnected with a ground path of said probe;
   (d) a planar fourth conductive member supported by said substrate suitable to be electrically interconnected with a first signal path of another probe;
   (e) a planar fifth conductive member supported by said substrate suitable to be electrically interconnected with a second signal path of said another probe;
   (f) a planar sixth conductive member supported by said substrate suitable to be electrically interconnected with a ground path of said another probe;
   (g) wherein said third conductive member and said sixth conductive member are spaced apart from one another, and a resistive material supported by said substrate at least partially extends between said third conductive member and said sixth conductive member, wherein the S11 characteristic from said first, second, and third conductive members has a loss of less than 0.05 dB between 30 GHz and 50 GHz.

2. The substrate of claim 1 wherein said S11 characteristic has a loss of less than 0.05 dB between 20 GHz and 60 GHz.

3. The substrate of claim 1 wherein said S11 characteristic has a loss of less than 0.05 dB between 10 GHz and 70 GHz.

4. The substrate of claim 1 wherein said S11 characteristic has a loss of less than 0.05 dB between 10 GHz and 100 GHz.

5. The substrate of claim 1 wherein said S11 characteristic has a loss of less than 0.025 dB.

6. The substrate of claim 2 wherein said S11 characteristic has a loss of less than 0.025 dB.

7. The substrate of claim 3 wherein said S11 characteristic has a loss of less than 0.025 dB.

8. The substrate of claim 4 wherein said S11 characteristic has a loss of less than 0.025 dB.

9. The substrate of claim 1 wherein said S11 characteristic has a loss of less than 0.02 dB.

10. The substrate of claim 2 wherein said S11 characteristic has a loss of less than 0.02 dB.

11. The substrate of claim 4 wherein said S11 characteristic has a loss of less than 0.02 dB.

12. The substrate of claim 4 wherein said S11 characteristic has a loss of less than 0.02 dB.

13. A calibration substrate for calibrating a probe comprising:
   (a) a planar first conductive member supported by said substrate suitable to be electrically interconnected with a first signal path of said probe;
   (b) a planar second conductive member supported by said substrate suitable to be electrically interconnected with a second signal path of said probe;
   (c) a planar third conductive member supported by said substrate suitable to be electrically interconnected with a ground path of said probe;
   (d) a planar fourth conductive member supported by said substrate suitable to be electrically interconnected with a first signal path of another probe;
   (e) a planar fifth conductive member supported by said substrate suitable to be electrically interconnected with a second signal path of said another probe;
   (f) a planar sixth conductive member supported by said substrate suitable to be electrically interconnected with a ground path of said another probe;
   (g) wherein said third conductive member and said sixth conductive member are spaced apart from one another, and a resistive material supported by said substrate at least partially extends between said third conductive member and said sixth conductive member, wherein the S11 characteristic from said first, second, and third conductive members has a Q factor of less than 5 between 30 GHz and 50 GHz.

14. The substrate of claim 13 wherein said Q factor is less than 3.

15. The substrate of claim 13 wherein said Q factor is less than 2.

16. The substrate of claim 13 wherein said Q factor is less than 1.2.

17. The substrate of claim 13 wherein said Q factor is less than 5 between 20 GHz and 60 GHz.

18. The substrate of claim 13 wherein said Q factor is less than 5 between 10 GHz and 70 GHz.

19. The substrate of claim 13 wherein said Q factor is less than 5 between 5 GHz and 100 GHz.

20. A calibration substrate for calibrating a probe comprising:
(a) a planar first conductive member supported by said substrate suitable to be electrically interconnected with a first signal path of said probe;
(b) a planar second conductive member supported by said substrate suitable to be electrically interconnected with a second signal path of said probe;
(c) a planar third conductive member supported by said substrate suitable to be electrically interconnected with a ground path of said probe;
(d) a planar fourth conductive member supported by said substrate suitable to be electrically interconnected with a first signal path of another probe;
(e) a planar fifth conductive member supported by said substrate suitable to be electrically interconnected with a second signal path of said another probe;
(f) a planar sixth conductive member supported by said substrate suitable to be electrically interconnected with a ground path of said another probe;
(g) wherein said third conductive member and said sixth conductive member are spaced apart from one another, and a resistive material supported by said substrate at least partially extends between said third conductive member and said sixth conductive member, wherein said resistive material matches within 10 percent the imaginary part of the primary mode conversion between 30 GHz and 50 GHz.

21. The substrate of claim 20 wherein said conversion is between 20 GHz and 60 GHz.

22. The substrate of claim 20 wherein said conversion is between 10 GHz and 70 GHz.

23. The substrate of claim 20 wherein said conversion is between 5 GHz and 100 GHz.

24. A calibration substrate for calibrating a probe comprising:
(a) a planar conducive region including a first conductive member supported by said substrate suitable to be electrically interconnected with a first signal path of said probe, a second conductive member supported by said substrate suitable to be electrically interconnected with a second signal path of said probe, and a third conductive member supported by said substrate suitable to be electrically interconnected with a ground path of said probe;
(b) wherein said conductive region includes an associated resistive material supported by said substrate that includes a resistance that reduces a resonance effect between 10 GHz and 100 GHz that would have otherwise occurred if the resistive material was not included to a level less than 50% of what would have otherwise occurred.

25. The substrate of claim 24 wherein said level is less than 75%.

26. The substrate of claim 25 wherein said level is less than 90%.

27. A calibration substrate for calibrating a probe comprising:
(a) a planar conducive region including a first conductive member supported by said substrate suitable to be electrically interconnected with a first signal path of said probe, a second conductive member supported by said substrate suitable to be electrically interconnected with a second signal path of said probe, and a third conductive member supported by said substrate suitable to be electrically interconnected with a ground path of said probe;
(b) wherein said conductive region includes an associated resistive material supported by said substrate that includes a resistance that is within 25 percent of the reactive part of the primary mode conversion between 10 GHz and 100 GHz that would have otherwise occurred if the resistive material was not included.

28. The substrate of claim 27 wherein said conversion is between 30 GHz and 50 GHz.

29. The substrate of claim 27 wherein said within 10 percent.

30. A calibration substrate for calibrating a probe comprising:
(a) a planar conductive region including a first conductive member supported by said substrate suitable to be electrically interconnected with a first signal path of said probe, a second conductive member supported by said substrate suitable to be electrically interconnected with a second signal path of said probe, and a third conductive member supported by said substrate suitable to be electrically interconnected with a ground path of said probe;
(b) wherein said conductive region includes an associated resistive material supported by said substrate, wherein the S11 characteristic from said first, second, and third conductive members has a loss of less than 0.05 dB between 30 GHz and 50 GHz.

31. The substrate of claim 30 wherein said S11 characteristic has a loss of less than 0.05 dB between 20 GHz and 60 GHz.

32. The substrate of claim 30 wherein said S11 characteristic has a loss of less than 0.05 dB between 10 GHz and 70 GHz.

33. The substrate of claim 30 wherein said S11 characteristic has a loss of less than 0.05 dB between 10 GHz and 100 GHz.

34. The substrate of claim 30 wherein said S11 characteristic has a loss of less than 0.025 dB.

35. The substrate of claim 31 wherein said S11 characteristic has a loss of less than 0.025 dB.

36. The substrate of claim 32 wherein said S11 characteristic has a loss of less than 0.025 dB.

37. The substrate of claim 33 wherein said S11 characteristic has a loss of less than 0.025 dB.

38. The substrate of claim 30 wherein said S11 characteristic has a loss of less than 0.02 dB.

39. The substrate of claim 31 wherein said S11 characteristic has a loss of less than 0.02 dB.

40. The substrate of claim 32 wherein said S11 characteristic has a loss of less than 0.02 dB.

41. The substrate of claim 33 wherein said S11 characteristic has a loss of less than 0.02 dB.

42. A calibration substrate for calibrating a probe comprising:
(a) a planar conductive region including a first conductive member supported by said substrate suitable to be electrically interconnected with a first signal path of said probe, and a second conductive member supported by said substrate suitable to be electrically interconnected with a ground path of said probe;
(b) wherein said conductive region includes an associated resistive material supported by said substrate, wherein the S11 characteristic from said first, and second, conductive members has a loss of less than 0.05 dB between 30 GHz and 50 GHz.

43. The substrate of claim 42 wherein said S11 characteristic has a loss of less than 0.05 dB between 20 GHz and 60 GHz.

44. The substrate of claim 42 wherein said S11 characteristic has a loss of less than 0.05 dB between 10 GHz and 70 GHz.

45. The substrate of claim 42 wherein said S11 characteristic has a loss of less than 0.05 dB between 10 GHz and 100 GHz.

46. The substrate of claim 42 wherein said S11 characteristic has a loss of less than 0.025 dB.

47. The substrate of claim 43 wherein said S11 characteristic has a loss of less than 0.025 dB.

48. The substrate of claim 44 wherein said S11 characteristic has a loss of less than 0.025 dB.

49. The substrate of claim 45 wherein said S11 characteristic has a loss of less than 0.025 dB.

50. The substrate of claim 42 wherein said S11 characteristic has a loss of less than 0.02 dB.

51. The substrate of claim 43 wherein said S11 characteristic has a loss of less than 0.02 dB.

52. The substrate of claim 44 wherein said S11 characteristic has a loss of less than 0.02 dB.

53. The substrate of claim 45 wherein said S11 characteristic has a loss of less than 0.02 dB.

* * * * *

UNITED STATES PATENT AND TRADEMARK OFFICE
CERTIFICATE OF CORRECTION

PATENT NO. : 8,069,491 B2
APPLICATION NO. : 11/820877
DATED : November 29, 2011
INVENTOR(S) : Timothy E. Lesher It is certified that error appears in the above-identified patent and that said Letters Patent is hereby corrected as shown below:

Column 8, Line 42, after "11. The substrate of claim" please delete "4" and insert --3--.

Column 9, Line 55, after "(a) a planar" please delete "conducive" and insert --conductive--.

Column 10, Line 10, after "(a) a planar" please delete "conducive" and insert --conductive--.

Column 10, Line 26, after "29. The substrate of claim 27 wherein said" please insert --resistance is--.

Signed and Sealed this
Seventh Day of February, 2012

David J. Kappos
*Director of the United States Patent and Trademark Office*